US008884328B2

(12) United States Patent
Lim et al.

(10) Patent No.: US 8,884,328 B2
(45) Date of Patent: Nov. 11, 2014

(54) LIGHT EMITTING DEVICE, LIGHT EMITTING DEVICE PACKAGE, AND LIGHTING SYSTEM

(75) Inventors: Woo Sik Lim, Seoul (KR); Sung Kyoon Kim, Seoul (KR); Sung Ho Choo, Seoul (KR); Byeong Kyun Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 160 days.

(21) Appl. No.: 13/031,788

(22) Filed: Feb. 22, 2011

(65) Prior Publication Data

US 2011/0210345 A1 Sep. 1, 2011

(30) Foreign Application Priority Data

Apr. 6, 2010 (KR) .................... 10-2010-0031333

(51) Int. Cl.
*H01L 33/38* (2010.01)
*H01L 33/20* (2010.01)
*H01L 33/08* (2010.01)

(52) U.S. Cl.
CPC ............... *H01L 33/38* (2013.01); *H01L 33/08* (2013.01); *H01L 33/20* (2013.01)
USPC ...................... 257/99; 257/88; 257/E33.065

(58) Field of Classification Search
None
See application file for complete search history.

(56) References Cited

U.S. PATENT DOCUMENTS

| 7,119,374 B2 * | 10/2006 | Hon et al. ................... 257/94 |
| 2004/0012030 A1 | 1/2004 | Chen et al. .................. 257/99 |
| 2007/0007584 A1 | 1/2007 | Hwang et al. ............... 257/324 |
| 2009/0039359 A1 * | 2/2009 | Yoon et al. .................. 257/88 |

FOREIGN PATENT DOCUMENTS

| EP | 1 553 640 A1 | 7/2005 |
| EP | 1 729 349 A1 | 6/2006 |
| EP | 2 207 211 A1 | 7/2010 |
| JP | 2000-174345 A | 6/2000 |
| KR | 10-0708934 B1 | 4/2007 |
| KR | 10-2008-0042340 A | 5/2008 |
| WO | WO 2009/075551 A2 | 6/2009 |

OTHER PUBLICATIONS

Europe Search Report dated Jun. 6, 2011 issued Application No. 11 15 7951.

* cited by examiner

*Primary Examiner* — Johannes P Mondt
(74) *Attorney, Agent, or Firm* — Ked & Associates, LLP

(57) ABSTRACT

Provided is a light emitting device. The light emitting device includes a light emitting structure layer comprising a first conductive type semiconductor layer, an active layer, and a second conductive type semiconductor layer, a first electrode connected to the first conductive type semiconductor layer, a current spreading layer on the second conductive type semiconductor layer, an insulation layer on the first electrode, and a second electrode comprising at least one bridge portion on the insulation layer and a first contact portion contacting at least one of the second conductive type semiconductor layer and the current spreading layer.

20 Claims, 20 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0031333 filed on Apr. 6, 2010, which is hereby incorporated by reference in its entirety.

BACKGROUND

Embodiments relate to a light emitting device, a light emitting device package, and a lighting system.

Due to their physical and chemical characteristics, Group III-V nitride semiconductors are being esteemed as core materials for light-emitting devices such as light-emitting diodes (LEDs) and laser diodes (LDs). Each of the Group III-V nitride semiconductors is formed of a semiconductor material having a compositional formula of $In_xAl_yGa_{1-x-y}N$ ($0 \le x \le 1$, $0 \le y \le 1$, $0 \le x+y \le 1$).

LEDs are a kind of semiconductor device that is used as a light source or uses the characteristics of compound semiconductors to convert electricity into infrared rays or light, thereby receiving or transmitting signals therebetween.

These semiconductor based LEDs or LDs are widely used in light-emitting devices, and are applied as light sources for various products such as keypad light-emitting units of mobile phones, electric light panels, and illumination devices.

SUMMARY

Embodiments provide a light emitting device having a new electrode structure.

Embodiments provide a light emitting device having a stacked structure of a current spreading layer and an insulation layer on a second conductive type semiconductor layer.

Embodiments provide a light emitting device having a stacked structure of a current spreading layer, an insulation layer, and a second electrode on a second conductive type semiconductor layer.

Embodiments provide a light emitting device having a stacked structure of a current spreading layer, an insulation layer, and a first electrode on a second conductive type semiconductor layer.

Embodiments provide a light emitting device in which patterns of first and second electrodes are disposed on a stacked structure of a second conductive type semiconductor layer, a current spreading layer, and an insulation layer.

Embodiments provide a light emitting device having a structure in which portions of patterns of the first and second electrodes vertically overlap each other.

Embodiments may improve reliability of a light emitting device package including a light emitting device and a lighting system.

In one embodiment, a light emitting device includes: a light emitting structure layer including a first conductive type semiconductor layer, an active layer, and a second conductive type semiconductor layer; a first electrode connected to the first conductive type semiconductor layer; a current spreading layer on the second conductive type semiconductor layer; an insulation layer on the first electrode; and a second electrode including at least one bridge portion on the insulation layer and a first contact portion contacting at least one of the second conductive type semiconductor layer and the current spreading layer.

In another embodiment, a light emitting device includes: a light emitting structure layer including a first conductive type semiconductor layer, an active layer on the first conductive type semiconductor layer, and a second conductive type semiconductor layer on the active layer; a first electrode on the first conductive type semiconductor layer; a current spreading layer formed of a transmissive material on the second conductive type semiconductor layer; an insulation layer on the first conductive type semiconductor layer; and a second electrode including at least one bridge portion on the insulation layer and at least one first contact portion contacting at least one of the second conductive type semiconductor layer and the current spreading layer.

The details of one or more embodiments are set forth in the accompanying drawings and the description below. Other features will be apparent from the description and drawings, and from the claims.

DETAILED DESCRIPTION OF THE EMBODIMENTS

Figure 1:
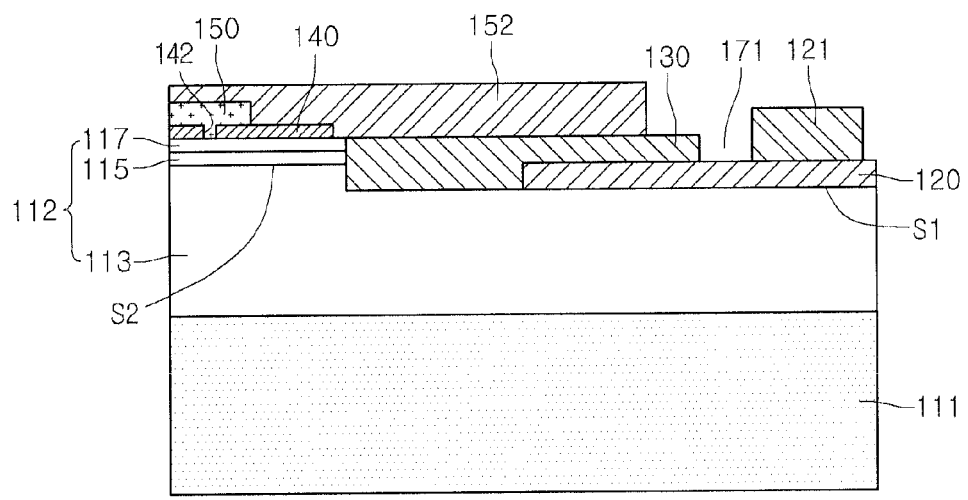
FIG. 1 is a side-sectional view of a light emitting device according to a first embodiment.

In the descriptions of embodiments, it will be understood that when a layer (or film), a region, a pattern, or a structure is referred to as being on a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, exemplary embodiments will be described with reference to the accompanying drawings.

FIG. 1 is a side-sectional view of a light emitting device according to a first embodiment.

Referring to FIG. 1, a light emitting device 100 includes a substrate 111, a first conductive type semiconductor layer 113, an active layer 115, a second conductive type semiconductor layer 117, first electrode parts 120 and 121, a insulation layer 130, second electrode parts 150 and 152, and a current spreading layer 140.

The substrate 111 may selectively use a transmissive substrate, an insulating substrate, and a conductive substrate. The substrate 111 may be formed of at least one of sapphire ($Al_2O_3$), SiC, Si, GaAs, GaN, ZnO, GaP, InP, and Ge. A light extraction structure such as an uneven pattern may be disposed on or/and under the substrate 111. The uneven pattern may have one of a stripe shape, a lens shape, a column shape, and a projection shape.

A first semiconductor layer including a compound semiconductor of Group II to VI elements may be disposed on the substrate 111. The first semiconductor layer may have a layer, a pattern, or a light extraction structure. The first semiconductor layer may include at least one of a buffer layer and an undoped semiconductor layer. The buffer layer may reduce a lattice mismatch between a GaN material and a substrate material. The buffer layer may be formed of at least one selected from the group consisting of GaN, InN, AlN, InGaN, AlGaN, InAlGaN, and AlInN. The undoped semiconductor layer may be disposed on the substrate 111 or the buffer layer. For example, the undoped semiconductor layer may be an undoped nitride-based semiconductor layer in which a conductive type dopant is not intentionally doped. The undoped semiconductor layer may be a semiconductor layer having significantly low conductivity than that of the first conductive type semiconductor layer. For example, the undoped semiconductor layer may be an undoped GaN layer and have a first conductive characteristic.

The buffer layer may have a superlattice structure in which different semiconductor layers from each other are alternately stacked on each other. The buffer layer may have at least two cycles of InGaN/GaN. The buffer layer may reduce a lattice mismatch transferred from the substrate 111.

A light emitting structure layer 112 may be disposed on the substrate 111 or the first semiconductor layer. The light emitting structure layer 112 may include at least three layers formed of a Group III-V compound semiconductor. At least two layer of the at least three layer may be doped with conductive type dopants different from each other.

The light emitting structure layer 112 may include the first conductive type semiconductor layer 113, the active layer 115, and the second conductive type semiconductor layer 117. Another semiconductor layer may be further disposed on or under each of the layers, but is not limited thereto.

The first conductive type semiconductor layer 113 may be disposed on the substrate 111 or the first semiconductor layer. The first conductive type semiconductor layer 113 may have a single- or multi-layered structure. A first conductive type dopant is doped into the first conductive type semiconductor layer 113.

The first conductive type semiconductor layer 113 may be formed of a Group III-V compound semiconductor, e.g., at least one selected from the group consisting of GaN, AlN, AlGaN, InGaN, InN, InAlGaN, AlInN, AlGaAs, GaP, GaAs, GaAsP, and AlGaInP. The first conductive type semiconductor layer 113 may be formed of a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 113 may be an N-type semiconductor layer. The N-type semiconductor layer may be doped with a first conductive type dopant, e.g., an N-type dopant such as Si, Ge, Sn, Se, or Te.

The first conductive type semiconductor layer 113 may have a superlattice structure in which semiconductor layers different from each other are stacked on each other. The superlattice structure may include a GaN/InGaN structure or a GaN/AlGaN structure. The superlattice structure may include a structure in which at least two pairs or more of two layers, each having a thickness of several A or more, different from each other are alternately stacked on each other. Alternatively, the superlattice structure may include at least two layers having band gaps different from each other.

At least first top surface S1 of the first conductive type semiconductor layer 113 may be stepped with a second top surface S2 of the first conductive type semiconductor layer 11. Also, the first top surface S1 may be a surface disposed more adjacent to the substrate 111. The first top surface S1 and the second top surface S2 may be surfaces of the same semiconductor layer or surfaces of different semiconductor layers from each other, but is not limited thereto. For example, the second top surface S2 of the first conductive type semiconductor layer 113 may be a surface contacting an lower surface of the active layer 115, and the at least top surface S1 of the first conductive type semiconductor layer 113 may be a surface disposed in a region in which the active layer 115 is removed.

The at least top surface S1 of the first conductive type semiconductor layer 113 may be formed as an electrode contact surface and spaced from a side surface of the active layer 115.

The active layer 115 may be disposed on the first conductive type semiconductor layer 113. The active layer 115 may have one of a single quantum well structure, a multi quantum well (MQW) structure, a quantum dot structure, and a quantum wire structure. The active layer 115 may be formed at a cycle of a well layer/barrier layer using a Group III-V compound semiconductor material. For example, the active layer 115 may have at least one of an InGaN/GaN structure, an InGaN/AlGaN structure, and an InGaN/InGaN structure. The barrier layer may be formed of a material having a band gap greater than that of the well layer, but is not limited thereto.

The active layer 115 may be formed of a material having band gap energy according to a wavelength of emitted light.

For example, when blue light having a wavelength of about 460 nm to about 470 nm is emitted, the active layer 115 may have a stacked structure of an InGaN well layer/GaN barrier layer. The active layer 115 may be formed of one selected from materials, which emit light having a visible wavelength such as a blue wavelength, a red wavelength, and a green wavelength, but is not limited thereto.

A first conductive type clad layer may be disposed between the first conductive type semiconductor layer 113 and the active layer 115. The first conductive type clad layer may include an N-type semiconductor layer. The first conductive type clad layer may be formed of a GaN-based semiconductor. The first conductive type clad layer may have a band gap greater than that of the barrier layer within the active layer 115 and restrict carriers.

A second conductive type clad layer may be disposed between the active layer 115 and the second conductive type semiconductor layer 117. The second conductive type clad layer may be formed of a GaN-based semiconductor. The second conductive type clad layer may have a band gap greater than that of the barrier layer within the active layer 115 and restrict carriers.

The first conductive type semiconductor layer 113 disposed more adjacent to the substrate 111 may have a thickness greater than that of the second conductive type semiconductor layer 117.

The second conductive type semiconductor layer 117 may be disposed on the active layer 115. The second conductive type semiconductor layer may be formed of a Group III-V compound semiconductor and doped with a second conductive type dopant. When the second conductive type semiconductor layer 117 may be a P-type semiconductor layer, the second conductive type semiconductor layer 117 may be formed of one of compound semiconductors such as GaN, InN, AlN, InGaN, AlGaN, InAlGaN, and AlInN. The second conductive type dopant may include P-type dopants such as Mg, Zn, Ca, Sr, and Ba.

The second conductive type semiconductor layer 117 may be formed of a semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 117 may have a single- or multi-layered structure. When the second conductive type semiconductor layer 117 has the multi-layered structure, the second conductive type semiconductor layer 117 may have a superlattice structure such as an AlGaN/GaN structure or a stacked structure of layers having dopant concentrations different from each other.

A portion of a top surface of the second conductive type semiconductor layer 117 may be used as the electrode contact surface.

A third conductive type semiconductor layer may be disposed on the second conductive type semiconductor layer 117. The third conductive type semiconductor layer may include a first conductive type semiconductor layer having a polarity opposite to that of the second conductive type semiconductor layer. For example, the third conductive type semiconductor layer may be formed of one of compound semiconductors such as GaN, InN, AlN, InGaN, AlGaN, InAlGaN, and AlInN. For example, the first conductive type semiconductor layer 113 and the third conductive type semiconductor layer may include N-type semiconductor layers, respectively.

The light emitting structure layer 112 may include the first conductive type semiconductor layer 113, the active layer 115, and the second conductive type semiconductor layer 117. The light emitting structure layer 112 may further include the third conductive type semiconductor layer. Also, the first conductive type semiconductor layer 113 may include the P-type semiconductor layer, and the second conductive type semiconductor layer 117 may include the N-type semiconductor layer. The light emitting structure layer 112 may have one of an N-P junction structure, a P-N junction structure, an N-P-N junction structure, and a P-N-P junction structure. Hereinafter, a structure in which the second conductive type semiconductor layer 117 is an uppermost layer of the light emitting structure layer 112 will be described as an example. That is, a second electrode contact layer may be the second conductive type semiconductor layer or the third conductive type semiconductor layer, which is disposed below the second electrode parts. Hereinafter, for convenience descriptions, a structure in which the second electrode contact layer is the second conductive type semiconductor layer will be described as an example.

The first electrode 120 is electrically connected to the first conductive type semiconductor layer 113 and includes a first pad 121.

The first electrode 120 may be disposed on the first top surface S1 of the first conductive type semiconductor layer 113. The first electrode 120 may be an electrode pattern, which is branched in at least one branch shape or a line shape. The first electrode 120 may be a contact portion contacting a top surface of the first conductive type semiconductor layer 113. Also, the first electrode 120 may have a branched structure such as a bridge structure, an arm structure, or a finger structure.

A first groove part 171 may be defined in at least one side of the first conductive type semiconductor layer 113, and the first electrode 120 and the insulation layer 130 may be disposed in the first groove part 171.

The first electrode 120 is disposed on the first top surface S1 of the first conductive type semiconductor layer 113. The insulation layer 130 is disposed around the first electrode 120. The first pad 121 may be disposed in an opened region of the insulation layer 130. The first pad 121 may be a portion of the first electrode 120 or a part separated from the first electrode 120.

The first pad 121 may be disposed on the first electrode in one or plurality. The first pad 121 may be disposed on a center or edge portion of the first electrode 120 to smoothly supply a power to the first electrode 120.

The first electrode 120 or/and the first pad 121 may include at least one layer using at least one or a plurality of mixed materials of Ti, Al, In, Ta, Pd, Co, Si, Ge, Ag, Rh, Au, Ir, Pt, W, and Au, but is not limited thereto.

The first electrode 120 may have at least one of various pattern shapes, for example, a linear pattern, a curve pattern, a linear-curve pattern, a branch pattern branching from one pattern, a polygonal pattern, a striped pattern, a lattice pattern, a dot pattern, a lozenge pattern, a parallelogram pattern, a mesh pattern, a stripe pattern, a cross pattern, a radial pattern, a circular pattern, and a mixed pattern thereof, but is not limited thereto. The first electrode 120 having such the pattern may smoothly supply a power to the first conductive type semiconductor layer 113 to prevent current from being concentrated onto one spot.

The first pad 121 may be formed of the same material as the first electrode 120 or a metal material adequate for bonding.

The insulation layer 130 may prevent the first electrode 120 from contacting the other semiconductor layers, e.g., the active layer 115 and the second conductive type semiconductor layer 117. The insulation layer 130 may be formed of an insulation material, e.g., one selected from materials such as $SiO_2$, $Si_3N_4$, $Al_2O_3$, and $TiO_2$, but is not limited thereto.

A first region of the insulation layer 130 is disposed between the second electrode 152 and the first conductive type semiconductor layer 113, and a second region of the layer 130 is disposed between the second electrode 152 and the first electrode 120. Thus, the second electrode 152 may be spaced from the first conductive type semiconductor layer 113 and the first electrode 120.

The current spreading layer 140 may be formed of a transmissive material or a reflective material. The current spreading layer 140 is disposed on the second conductive type semiconductor layer 117. The second electrode parts 150 and 152 may be disposed on the current spreading layer 140 and supply a power having a second polarity to the current spreading layer 140 or/and the second conductive type semiconductor layer 117.

A second electrode 150 may include a second contact portion 150 disposed under the second electrode 152. The second contact portion 150 may contact a top surface of the second conductive type semiconductor layer 117. For example, the second contact portion 150 may extend to the top surface of the second conductive type semiconductor layer 117 through an opening 142 of the current spreading layer 140.

The second contact portion 150 may be disposed between the current spreading layer 140 and the second electrode 152.

The second electrode 152 may be disposed on the second contact portion 150, the current spreading layer 140, and the insulation layer 152. Also, a portion of the second electrode 152 may contact the top surface of the second conductive type semiconductor layer 117.

At least portion of the second electrode 152 may serve as a pad. A power supplied from the pad may be diffused by the current spreading layer 140 via the second contact portion 150 and supplied to the second conductive type semiconductor layer 117.

A first part of the second electrode 152 may be disposed on the current spreading layer 140, and a second part of the second electrode 152 may extend on the insulation layer 130.

A first region of the current spreading layer 140 may be disposed between the light emitting structure layer 112 and the second contact portion 150. Also, a second region of the current spreading layer 140 may be disposed between the light emitting structure layer 112 and the second electrode 152. The current spreading layer 140 may extend on the insulation layer 130.

The current spreading layer 140 may have a width less than that of the second conductive type semiconductor layer 117. A top surface of an edge portion of the second conductive type semiconductor layer 117 may be opened from the current spreading layer 140.

The second electrode parts 150 and 152 may at least one layer formed of at least one selected from the group consisting of Ag, Ag alloy, Ni, Al, Al alloy, Rh, Pd, Ir, Ru, Mg, Zn, Pt, Au, and Hf or a combination thereof, but is not limited thereto. A portion of the second electrode parts 150 and 152 may include a pad, but is not limited thereto.

The current spreading layer 140 may include a transmissive conductive layer which includes a oxide-based material or a nitride-based material. For example, the current spreading layer 140 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), ZnO, RuOx, TiOx, IrOx, and $SnO_2$. Alternatively, the current spreading layer 140 may include a transmissive oxide layer or a transmissive nitride layer, but is not limited thereto. Also, a metal (e.g., Au or Al) through which light can be transmitted may be stacked in a thin film shape to form the current spreading layer 140.

An ohmic layer may be disposed between the current spreading layer 140 and the second conductive type semiconductor layer 119 or the third conductive type semiconductor layer, but is not limited thereto.

In the structure of FIG. 1, the current spreading layer 140 and the insulation layer 130 may be spaced apart from each other so that they are disposed in regions different from each other. That is, since the current spreading layer 140 and the insulation layer 130 may be formed of dielectrics different from each other and disposed in the regions different from each other, it may prevent light from being lost by total internal reflection and Fresnel reflection. In addition, the insulating layers 130 and the current spreading layer 140 different from each other may be easily controlled in refractive index and thickness.

The second electrode 152 of the second electrode parts 150 and 152 may have at least one selected from the group consisting of various pattern shapes, for example, a linear pattern, a curve pattern, a linear-curve pattern, a branch pattern branching from one pattern, a polygonal pattern, a striped pattern, a lattice pattern, a dot pattern, a lozenge pattern, a parallelogram pattern, a mesh pattern, a stripe pattern, a cross pattern, a radial pattern, a circular pattern, and a mixed pattern thereof, but is not limited thereto. The second electrode 152 having such the pattern may smoothly supply a power to the second conductive type semiconductor layer 117 through the current spreading layer 140 to prevent current from being concentrated onto one spot.

A portion of the second electrode 152 of the second electrode parts 150 and 152 may overlap a portion of the first electrode 120 disposed under the insulation layer 120, i.e., a portion of the second electrode 152 and a portion of the first electrode 120 may vertically overlap each other. Thus, a region, which blocks light emitted from the active layer 115, may be reduced to improve external quantum efficiency.

Figure 2:
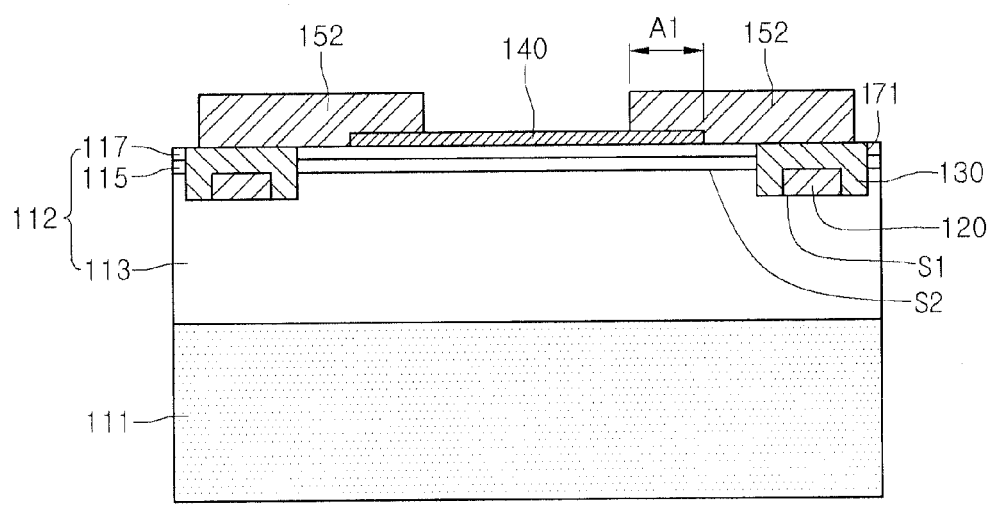
FIG. 2 is a side-sectional view of a light emitting device according to a second embodiment.

FIG. 2 is a side-sectional view of a light emitting device according to a second embodiment. In description of the second embodiment, the same part as the first embodiment will be described with reference to the first embodiment, and their duplicated descriptions will be omitted.

Referring to FIG. 2, a light emitting device 101 has a structure in which a first electrode 120 is disposed in each of both edge regions spaced from a center region. For example, the first electrode 120 is disposed within a first groove part 171 and contacts a first top surface S1 of a first conductive type semiconductor layer 113. An insulation layer 130 may be disposed around the first groove part 171.

A current spreading layer 140 is disposed on a second conductive type semiconductor layer 117 and spaced from the insulation layer 130.

A second electrode 152 of a second electrode parts may be selectively disposed on the insulation layer 130, the second conductive type semiconductor layer 117, and the current spreading layer 140.

A second part of a second electrode 152 of the second electrode parts may vertically overlap a portion (e.g., branch pattern) of the first electrode 120. In this case, since the second part of the second electrode 152 is disposed on a region except the active layer 115, light extraction efficiency may be improved. A first region A1 of the second electrode 152 of the second electrode parts may be overlappingly disposed on the current spreading layer 140.

Figure 3:
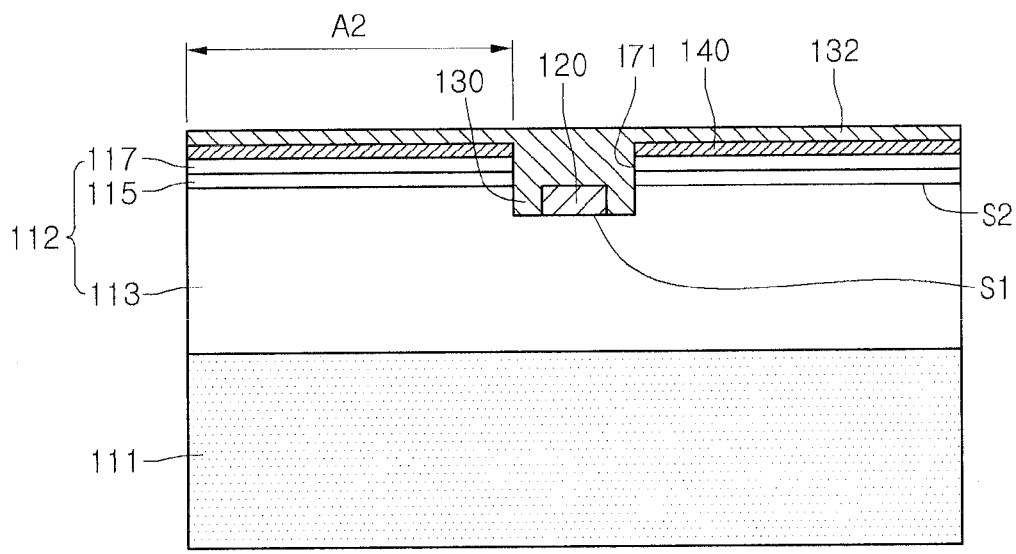
FIG. 3 is a side-sectional view of a light emitting device according to a third embodiment.

FIG. 3 is a side-sectional view of a light emitting device according to a third embodiment. In description of the third embodiment, the same part as the first embodiment will be described with reference to the first embodiment, and their duplicated descriptions will be omitted.

Referring to FIG. 3, a light emitting device 102 has a structure in which an insulation layer 130 is stacked on a current spreading layer 140.

The insulation layer 130 is disposed around a first electrode 120 disposed in a first groove part 171. A portion 132 of the insulation layer 130 may extend on a top surface of the current spreading layer 140. The current spreading layer 140 may be disposed between the insulation and a second conductive type semiconductor layer 117. The insulation layer 130 may be overlapping disposed on a second region A2 of the current spreading layer 140.

Here, when the current spreading layer 140 is formed of ITO and the insulation layer 130 is formed of $SiO_2$, the ITO has a refractive index of about 2.0, the $SiO_2$ has a refractive index of about 1.46, and the GaN has a refractive index of about 2.4. Thus, a portion of light emitted from the active layer 115 transmits the second conductive type semiconductor layer 117 and the ITO. In this case, the light may be totally reflected from an interface between the ITO medium and the $SiO_2$ medium due to a difference of the refractive indexes. The portion 132 of the insulation layer 130 and the current spreading layer 140 may have adequate thicknesses according to a wavelength of the light emitted from the active layer 115.

The current spreading layer 140 may have a roughness surface. Thus, since an insulating layer has a roughness interface, a critical angle of the light may be changed.

Figure 4:
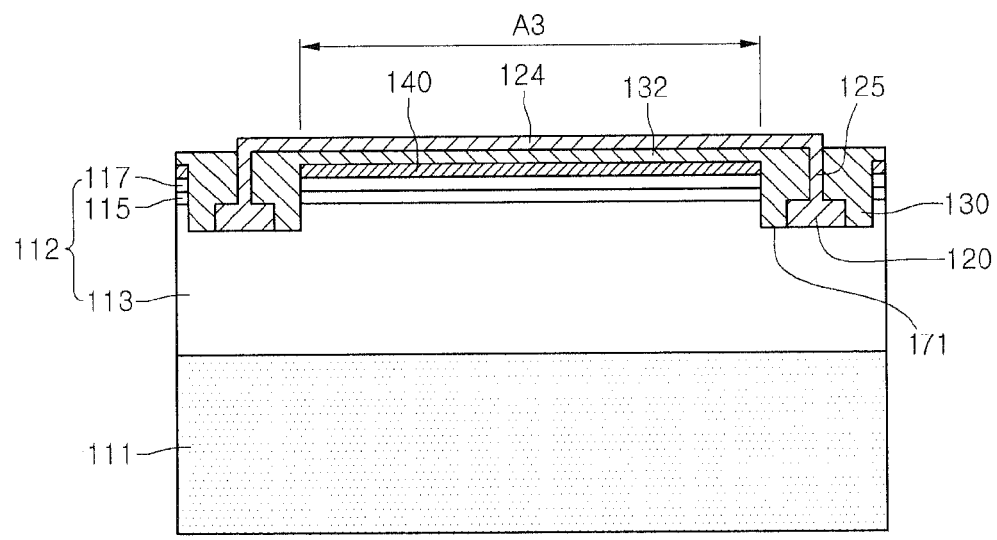
FIG. 4 is a side-sectional view of a light emitting device according to a fourth embodiment.

FIG. 4 is a side-sectional view of a light emitting device according to a fourth embodiment. In description of the fourth embodiment, the same part as the first embodiment will be described with reference to the first embodiment, and their duplicated descriptions will be omitted.

Referring to FIG. 4, in a light emitting device 103, a first electrode 120 is disposed on a first conductive type semiconductor layer 113, and an insulation layer 130 is disposed around the first electrode 120. A current spreading layer 140 may be disposed on a second conductive type semiconductor layer 117, and a portion 132 of the insulation layer 130 may extend on the current spreading layer 140.

A plurality of first electrodes 120 may be disposed on both sides of the first conductive type semiconductor layer 113. The plurality of first electrodes 120 may be connected to each other by a bridge portion 124. Both ends of the bridge portion 124 may be connected to connection electrodes 125 disposed within the insulation layer 130, respectively. Each of the connection electrodes 125 may be connected to each of the first electrode 120. That is, the bridge portion 124 extends along the top surface of the insulation layer 130 to electrically connect the plurality of first electrodes 120 to each other. The bridge portion 124 is a connection part or spreading part.

The bridge portion 124 connected to the first electrode 120 is disposed on a stacked structure of the insulation layer 130/the current spreading layer 140. In this case, a portion of light emitted from an active layer 115 may be totally reflected from an interface between the current spreading layer 140 and the insulation layer 130 due to a difference of refractive indexes of the two media. Thus, the bridge portion 124 may prevent light from being absorbed in this region A3.

Figure 29:
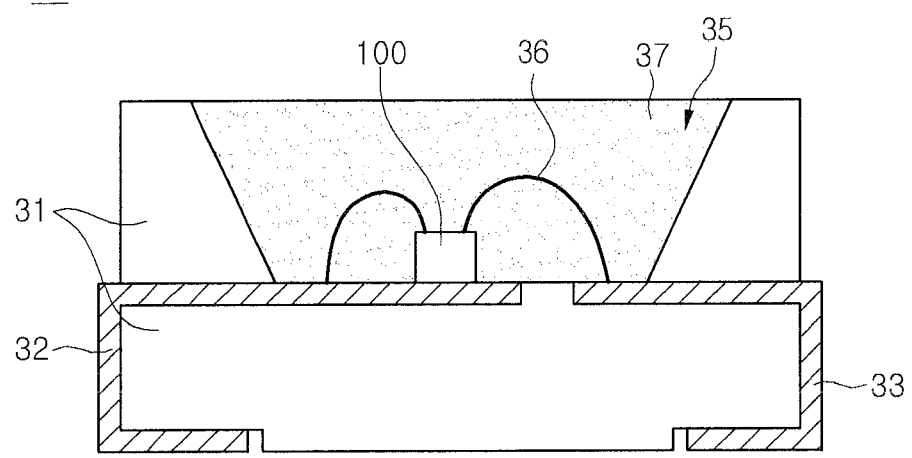
FIG. 29 is a view of a light emitting device package according to an embodiment.

Characteristics of the first to fourth embodiments of FIGS. 1 to 4 may be selectively applied to each embodiment or the other embodiment, or applied to all of the embodiments. For example, the light emitting device may be mounted in a manner as shown in FIG. 29 or mounted in a flip chip manner having a reverse structure to that shown in FIG. 29. According to the flip chip manner, a substrate is disposed facing upside and first and second pads are die-bonded on a lead electrode.

FIGS. 5 to 8 are a perspective view and side-sectional views of a light emitting device according to a fifth embodiment. In description of the fifth embodiment, the same part as the first to fourth embodiments will be described with reference to the first to fourth embodiments, and their duplicated descriptions will be omitted.

Figure 5:
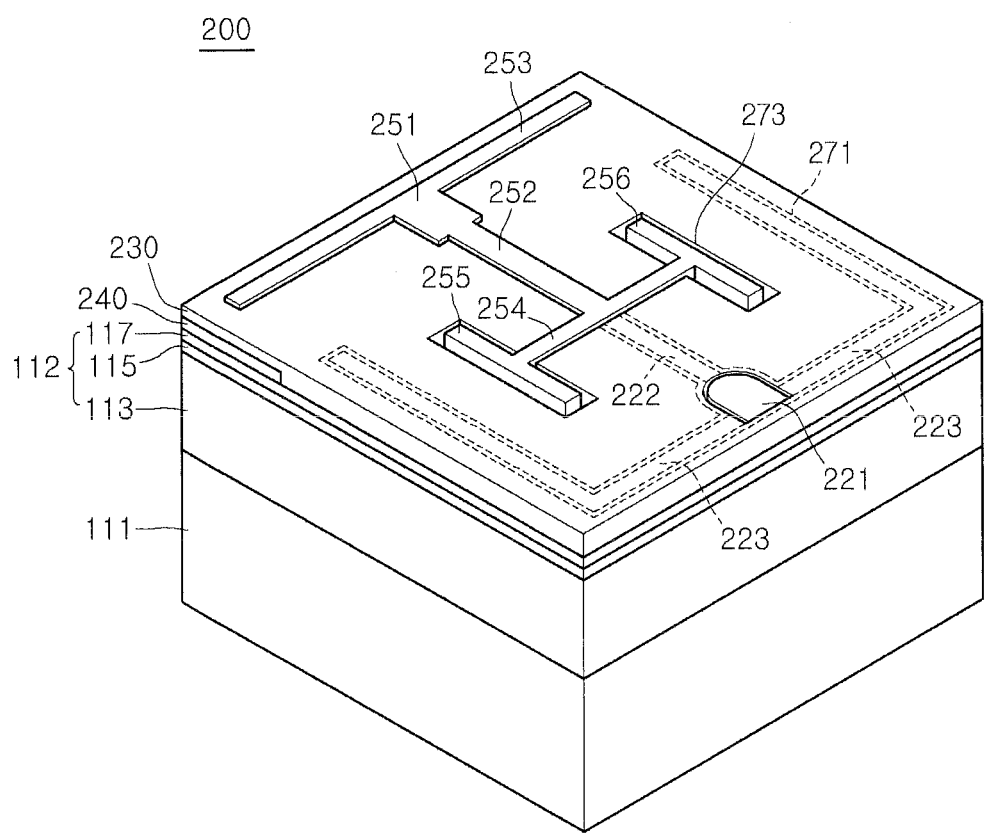
FIG. 5 is a perspective view of a light emitting device according to a fifth embodiment.
Figure 6:
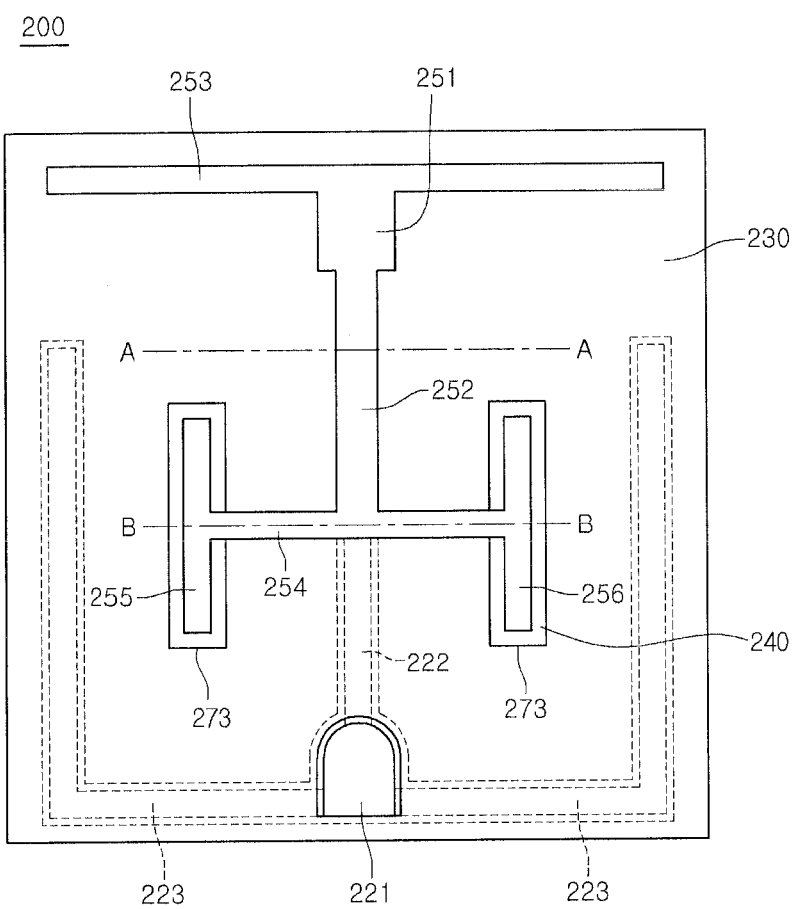
FIG. 6 is a plan view illustrating the light emitting device of FIG. 5.
Figure 7:
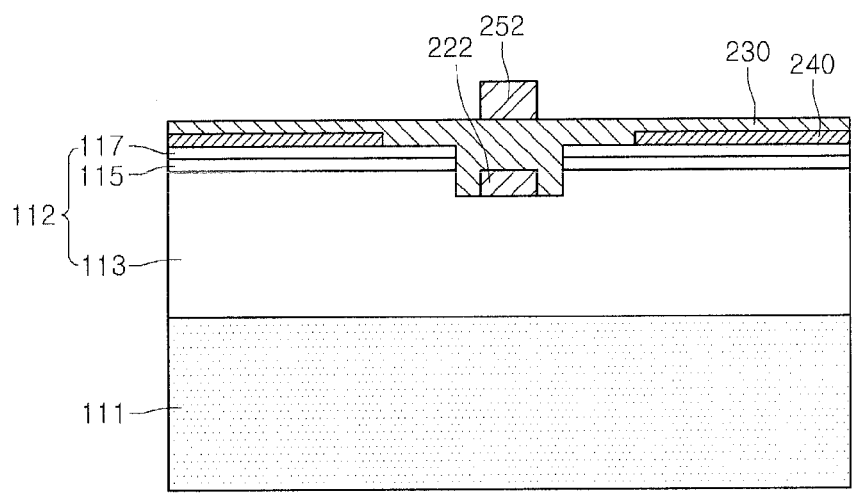
FIG. 7 is a side-sectional view taken along line A-A of FIG. 6.
Figure 8:
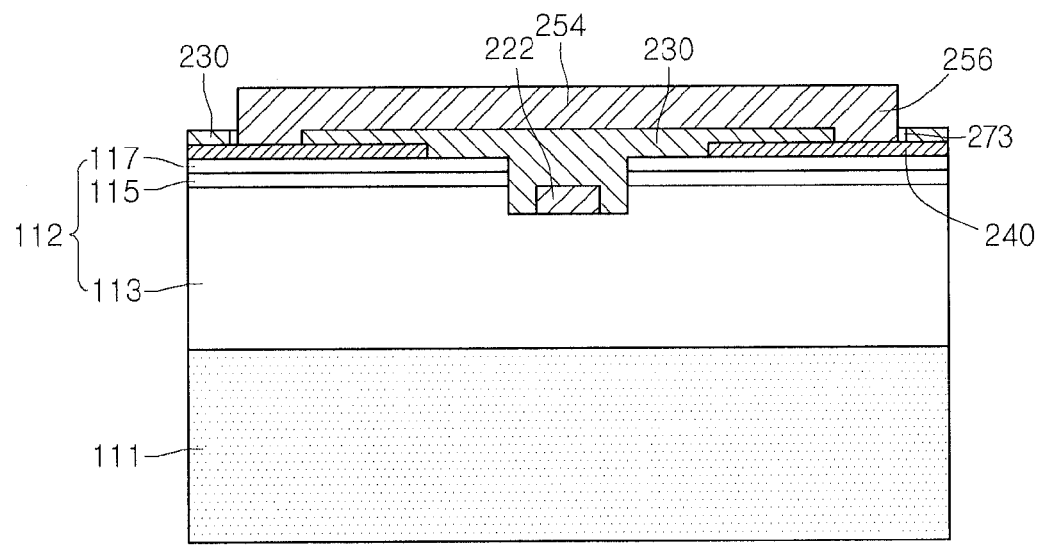
FIG. 8 is a side-sectional view taken along line B-B of FIG. 6.

FIG. 5 is a perspective view of the light emitting device, and FIG. 6 is a plan view illustrating the light emitting device of FIG. 5. FIG. 7 is a side-sectional view taken along line A-A of FIG. 6, and FIG. 8 is a side-sectional view taken along line B-B of FIG. 6.

Referring to FIGS. 5 and 6, in a light emitting device 200, a current spreading layer 240 is disposed on a first region of a second conductive type semiconductor layer 117, and an insulation layer 230 is disposed on a second region. The second region may be a region except the first region or a portion of the first region. Also, the insulation layer 230 may extend on the current spreading layer 240 and totally reflect a portion of light incident through the current spreading layer 240. The insulation layer 230 may have a width greater than that of the current spreading layer 240.

The insulation layer 230 has at least one opening 273 in a predetermined region. The opening 273 may expose a portion the current spreading layer 240.

A first electrode part includes a first pad 221 and first electrodes 222 and 223, which are branched in at least one direction. The insulation layer 230 is disposed around the first electrodes 222 and 223. The first electrodes 222 and 223 may be disposed in a first groove part 271 of a light emitting structure layer 112.

The first electrodes 222 and 223 may include a first internal electrode 222 and a first side electrode 223. The first electrodes 222 and 223 may be connected to the first pad 221. At least portions of the first internal electrode 222 and the first side electrode 223 may be used as contact portions. The contact portions may directly contact a first conductive type semiconductor layer.

The first internal electrode 222 extends from the first pad 221 to a center direction. The first side electrode 223 extends from the first pad 221 to side directions opposite to each other. The first pad 221 may be disposed on the first internal electrode 222 and a central portion of the first side electrode 223 or in an edge region between two edges adjacent to each other. The first pad 221 may be disposed in the edge region or the other region, but is not limited thereto. Both ends of the first side electrode 223 may be disposed on sides opposite to each other. Also, both ends of the first side electrode 223 may be spaced apart from the first internal electrode 222 with the same distance or distances different from each other.

The center direction is a direction gradually approached from at least one side surface toward a center of the device, and the edge region is a region disposed more adjacent to the side surface than the center of the device.

A second electrodes 252 and 253 include a second pad 251. The second pad 251 is disposed on a region opposite to that of the first pad 221, and the second electrodes 252 and 253 include a second side electrode 253 and a second internal electrode 252. The second side electrode 253 and the second internal electrode 252 may be used as bridge portions. Each of the bridge portions may be disposed on the insulation layer 230.

The second pad 251 is disposed at a central portion of the second side electrode 253 and the second internal electrode 252. Also, the second pad 251 is disposed on the insulation layer 230. At least one second pad 251 may be provided and electrically connected to the second electrodes 252 and 253. The second side electrode 253 may extend in at least one direction from the second pad 251, in a plurality of direction having a predetermined interior angle, and in at least one direction of directions opposite to each other.

The second side electrode 253 extends to sides opposite to each other in the at least one edge region of the insulation layer 230. The second internal electrode 252 extends from the second pad 251 to a top surface of the first internal electrode 222. At least portions of the first internal electrode 222 and the second internal electrode 252 may vertically overlap each other with the insulation layer 230 therebetween. At least regions of patterns of the first electrode part and the second electrode part may overlap each other.

Here, the second internal electrode 252 of the second electrode part includes a bridge portion 254 and contact portions 255 and 256. The bridge portion 254 crosses an end of the second internal electrode 252 and extends in at least one direction. Each of the contact portions 255 and 256 crosses each of ends of the bridge portion 254 and extends in at least one direction. The contact portions 255 and 256 may contact at least one selected from the group consisting of the second conductive type semiconductor layer 117 or/and the current spreading layer 240.

The bridge portion 254 is branched from the second internal electrode 252 in at least two directions (e.g., T shape). Each of the contact portions 255 and 256 may be branched from both ends of the bridge portion 254 in at least two directions. The structure branched in the at least two directions may include a structure, which is branched in directions opposite to each other or extends in directions missed each other at an acute angle or an obtuse angle.

Each of the contact portions 255 and 256 may be disposed in a region between the first internal electrode 222 and the first side electrode 223 of the first electrode part.

The second pad 251 of the second electrode part may contact at least one of the second conductive type semiconductor layer 117 and the current spreading layer 240.

At least one of the second side electrode 253, the second internal electrode 252, and the bridge portion 254 of the second electrode part may be disposed on the insulation layer 230. The first and second contact portions 255 and 256 may contact top surface(s) the current spreading layer 240 or/and the second conductive type semiconductor layer 117 through the opening 273 of the insulation layer 230. In the structures of the parts 251 to 253 of the second electrode part, since an end of each of the electrodes directly contacts the current spreading layer 240, a current may be smoothly supplied through the contact portions thereof.

FIG. 7 is a side-sectional view taken along line A-A of FIG. 6.

Referring to FIGS. 6 and 7, the internal electrode 252 of the second electrode part and the internal electrode 222 of the first electrode part are disposed on and under the insulation layer 230, respectively. In addition, the first and second internal electrodes 252 and 222 vertically overlap each other. This electrode structure may prevent a light emitting area from being reduced to improve light extraction efficiency.

FIG. 8 is a side-sectional view taken along line B-B of FIG. 6.

Referring to FIGS. 6 and 8, the first and second contact portions 255 and 256 of the second electrode part may directly contact a top surface of the current spreading layer 240 through the opening 273 of the insulation layer 230. The first and second contact portions 255 and 256 of the second electrode part may be departed from the first internal electrode 222 of the first electrode part. Thus, the supplied current may be diffused within the light emitting structure layer 112.

FIGS. 9 to 16 are views illustrating a process of manufacturing a light emitting device according to a sixth embodiment.

Figure 9:
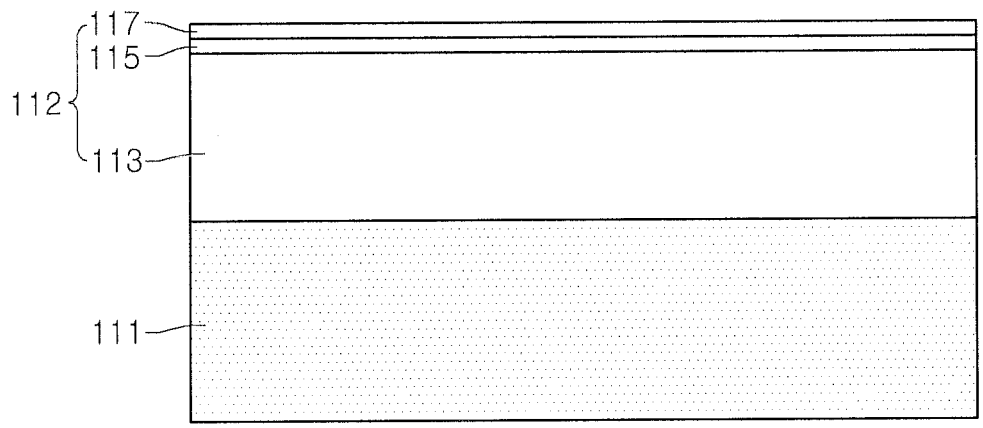
FIGS. 9 to 16 are views illustrating a process of manufacturing a light emitting device according to a sixth embodiment.

Referring to FIG. 9, a substrate 111 is loaded on growth equipment, and a light emitting structure layer 112 is formed on the substrate 111.

The substrate 111 may be formed of at least one selected from the group consisting of sapphire ($Al_2O_3$), SiC, Si, GaAs, GaN, ZnO, GaP, InP, and Ge. Also, the substrate may have a light extraction structure such as an uneven pattern on a top surface and a lower surface thereof.

The growth equipment may include an E-beam evaporator, physical vapor deposition (PVD), chemical vapor deposition (CVD), plasma laser deposition (PLD), a dual-type thermal evaporator, sputtering, and metal organic chemical vapor deposition (MOCVD), but is not limited thereto. The semiconductor may include a compound semiconductor of Group II to VI elements, e.g., a compound semiconductor having a compositional formula $In_xAl_yGa_{1-x-y}N$ ($0 \le x \le 1$, $0 \le y \le 1$, $0 \le x+y \le 1$).

A layer or pattern formed of a Group II to VI compound semiconductor material may be formed between the substrate 111 and the light emitting structure layer 112. For example, a buffer layer (not shown) and/or an undoped semiconductor layer (not shown) may be formed between the substrate 111 and the light emitting structure layer 112. The buffer layer may reduce a lattice mismatch between a GaN material and the substrate material. The buffer layer may be formed of at least one selected from the group consisting of GaN, InN, AlN, InGaN, AlGaN, InAlGaN, and AlInN. The undoped semiconductor layer may be formed on the substrate 111 or the buffer layer. The undoped semiconductor layer may include an undoped GaN-based layer.

The light emitting structure layer 112 includes a first conductive type semiconductor layer 113, an active layer 115, and a second conductive type semiconductor layer 117.

The first conductive type semiconductor layer 113 is formed on the substrate 111, and the first conductive type semiconductor layer 113 is doped with a first conductive type dopant and includes at least one layer. At least portion of the first conductive type semiconductor layer 113 contacts a first electrode.

For example, the first conductive type semiconductor layer 113 may be formed of at least one selected from the group consisting of GaN, InN, AlN, InGaN, AlGaN, InAlGaN, and AlInN. The first conductive type semiconductor layer 113 may be an N-type semiconductor layer, and the first conductive type dopant may include an N-type dopant such as Si, Ge, Sn, Se, or Te.

The active layer 115 is formed on the first conductive type semiconductor layer 113. The active layer 115 may have one of a single quantum well structure, a multi quantum well (MQW) structure, a quantum dot structure, and a quantum wire structure. The active layer 115 may be formed at a cycle of a well layer/barrier layer, for example, may be formed of an InGaN/GaN structure, an InGaN/AlGaN structure, or an InGaN/InGaN structure. The barrier layer may be formed of a material having a band gap greater than that of the well layer. The active layer 115 may be formed of a material having band gap energy according to a wavelength of emitted light. For example, when blue light having a wavelength of about 460 nm to about 470 nm is emitted, the active layer 115 may be formed at a cycle of an InGaN well layer/GaN barrier layer and have the single or multi quantum well structure. The active layer 115 may be formed of one selected from materials, which emit light having a visible wavelength such as a blue wavelength, a red wavelength, and a green wavelength, but is not limited thereto.

A first conductive type clad layer (not shown) may be disposed between the first conductive type semiconductor layer 113 and the active layer 115. When the first conductive type clad layer includes an N-type semiconductor layer, the first conductive type clad layer may include an N-type GaN-based semiconductor layer, but is not limited thereto.

A second conductive type semiconductor layer 117 is formed on the active layer 115. The second conductive type semiconductor layer 117 may include at least one semiconductor layer, which is doped with a second conductive type dopant. At least portion of the second conductive type semiconductor layer 117 may contact a second electrode. For example, the second conductive type semiconductor layer 117 may be formed of one of compound semiconductor materials such as GaN, InN, AlN, InGaN, AlGaN, InAlGaN, and AlInN. The second conductive type semiconductor layer 117 may include a P-type semiconductor layer. The second conductive type dopant may include a P-type dopant such as Mg, Zn, Ca, Sr, or Ba.

A second conductive type clad layer (not shown) may be formed between the second conductive type semiconductor layer 117 and the active layer 115. The second conductive type clad layer may include a GaN-based semiconductor layer, but is not limited thereto. The first conductive type semiconductor layer 113 may be realized with an N-type semiconductor layer and the second conductive type semiconductor layer 117 may be realized with a P-type semiconductor layer, or vice versa.

A third conductive type semiconductor layer (not shown), which is a semiconductor layer having a polarity opposite to that of the second conductive type semiconductor layer 117 may be formed on the second conductive type semiconductor layer 117. The third conductive type semiconductor layer may include a semiconductor layer doped with the first conductive type dopant, for example, be formed of one of compound semiconductors such as GaN, InN, AlN, InGaN, AlGaN, InAlGaN, and AlInN. For example, when the third conductive type semiconductor layer includes the N-type semiconductor layer, the first conductive type dopant may include an N-type dopant such as Si, Ge, Sn, Se, or Te.

The light emitting structure layer 112 may include the first conductive type semiconductor layer 113, the active layer 115, and the second conductive type semiconductor layer 117. The light emitting structure layer 112 may further include the third conductive type semiconductor layer. Also, the first conductive type semiconductor layer 113 may include the P-type semiconductor layer, and the second conductive type semiconductor layer 117 may include the N-type semiconductor layer.

Figure 10:
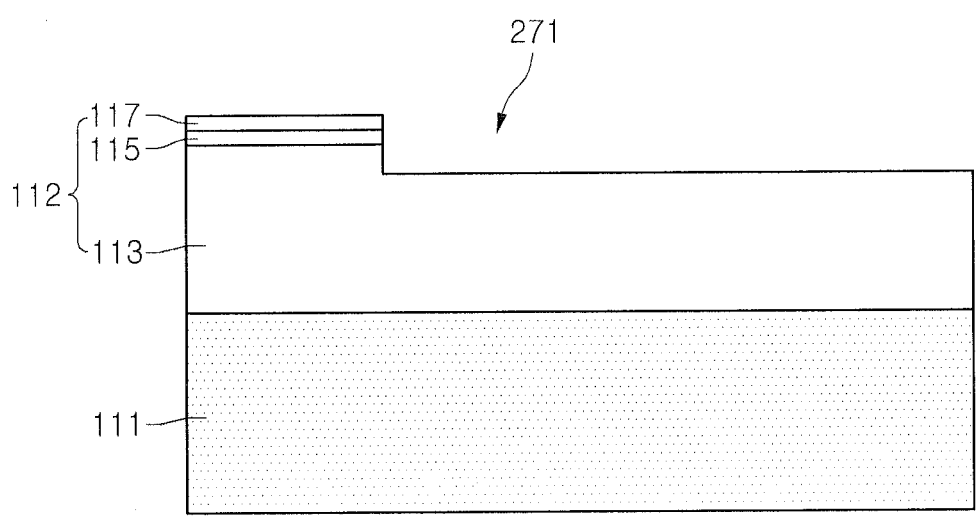
Figure 11:
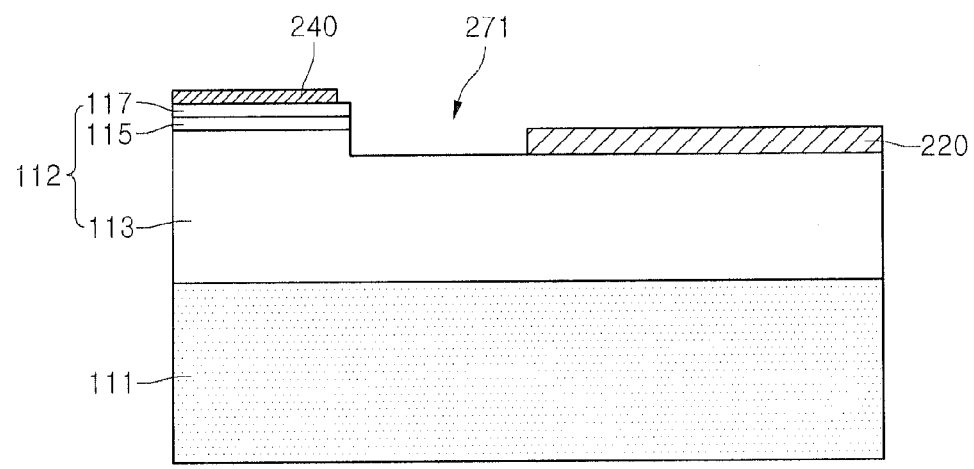

Referring to FIGS. 10 and 11, an etch process is performed to expose a portion of the first conductive type semiconductor layer 113. The etch process includes a dry etch process or/and a wet etch process. The exposed region of the first conductive type semiconductor layer 113 may be formed as a first groove part 271. The first groove part 271 may have a width less than that of the above-described first electrode. Here, the first groove part 271 may be formed through the etch process after the semiconductor layers 113, 115, and 117 are formed. Alternatively, a separate mask structure having a predetermined size may be formed, and then other layer structures may be formed to form the first groove part 271.

A first branch 220 branched in at least one branch shape is formed in the first groove part 271. The first electrode 220 is formed on the first conductive type semiconductor layer 113 and spaced from the active layer 115 and the second conductive type semiconductor layer 117. In this case, the outside of the active layer 115 and the second conductive type semiconductor layer 117 may be protected by the mask pattern or the insulation layer, and then, the first electrode 220 may be formed.

The first electrode 220 may include at least one layer formed using at least one or a plurality of mixed materials of Ti, Al, In, Ta, Pd, Co, Ni, Si, Ge, Ag, Rh, Au, Ir, Pt, W, and Au, but is not limited thereto. The first electrode 220 may be formed into a single- or multi-layer using one of sputtering, deposition, or plating equipment.

The first electrode 120 may have at least one of various pattern shapes, for example, a linear pattern, a curve pattern, a linear-curve pattern, a branch pattern branching from one pattern (one-pronged spear or multi-pronged spear shape), a polygonal pattern, a lattice pattern, a dot pattern, a lozenge pattern, a parallelogram pattern, a mesh pattern, a stripe pattern, a cross pattern, a radial pattern, a circular pattern, and a mixed pattern thereof, but is not limited thereto. The first electrode 120 having such the pattern may smoothly supply a power to the first conductive type semiconductor layer 113 to prevent current from being concentrated onto one spot.

A current spreading layer 240 is formed on the second conductive type semiconductor layer 117. The current spreading layer 240 may be formed on a top surface of the second conductive type semiconductor layer 117 in a region except the first groove part 271. A masking process may be performed using the mask pattern to form the current spreading layer 240 using the sputtering or deposition equipment, but is not limited thereto.

The current spreading layer 240 may have a thickness of several hundreds Å or more, but is not limited thereto.

The current spreading layer 240 includes a transmissive conductive layer. For example, the current spreading layer 240 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), ZnO, RuOx, TiOx, IrOx, and $SnO_2$, a transmissive oxide layer and a transmissive nitride layer, but is not limited thereto. Alternatively, the current spreading layer 240 may be formed in a thin film using a metal (e.g., Au or Al) to transmit light.

Figure 12:
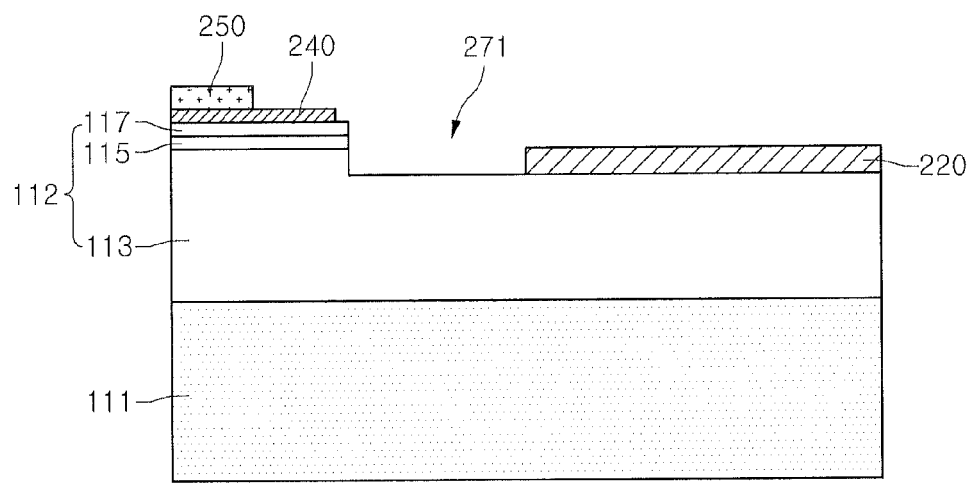

Referring to FIG. 12, a contact portion 250 of the second electrode part is formed on the current spreading layer 240. The contact portion 250 may contact the current spreading layer 240 or/and the second conductive type semiconductor layer 117. The contact portion 250 may contact the second conductive type semiconductor layer 117 through an opening of the current spreading layer 240.

Figure 13:
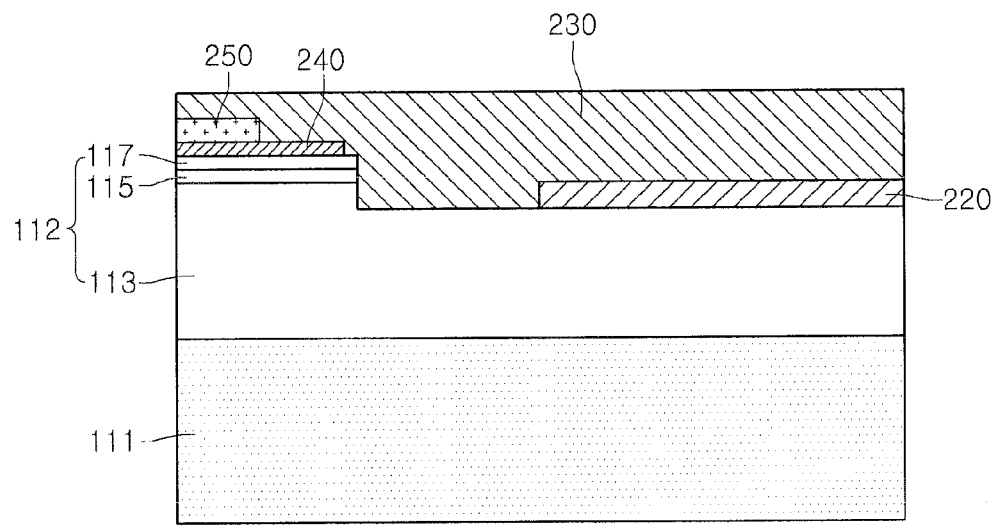
Figure 14:
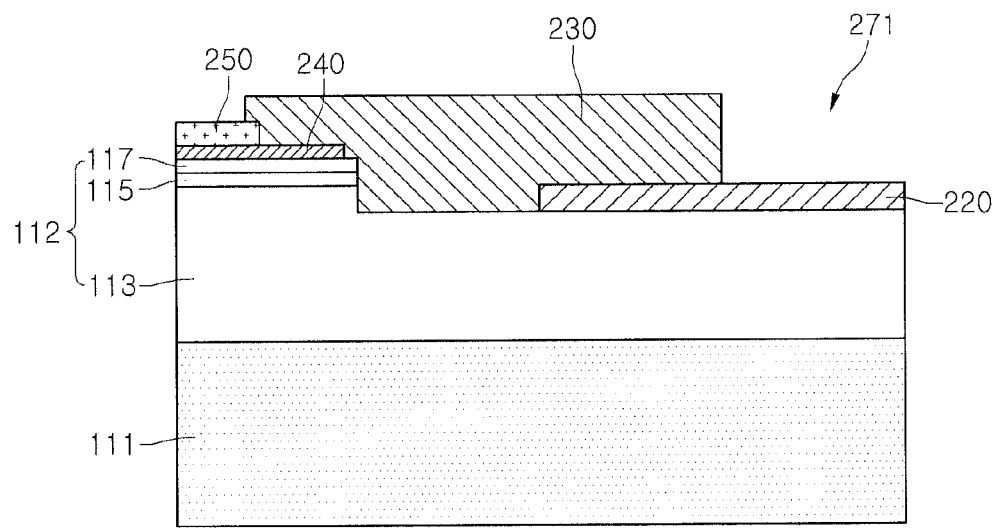

Referring to FIGS. 13 and 14, an insulation layer 230 is formed. The insulation layer 230 may be formed on the second electrode part, the current spreading layer 240, the first electrode 220, and the first conductive type semiconductor layer 113. Alternatively, the insulation layer 230 may be formed on a desired position using the mask pattern. The insulation layer 230 may be formed of one selected from insulation materials such as $SiO_2$, $Si_3N_4$, $Al_2O_3$, $TiO_2$, but is not limited thereto. The insulation layer 230 may be deposited using a sputtering process, but is not limited thereto.

An etch process is performed on the insulation layer 230 to expose the contact portion 250 of the second electrode part and a portion of the first electrode 220. In this case, the insulation layer 230 may be disposed around the first electrode 220 to prevent the first electrode 220 from being electrically connected to the other semiconductor layer.

A portion of the insulation layer 230 may be stacked on the current spreading layer 240 to totally reflect light incident into the current spreading layer 240. Also, since the current spreading layer 240 is formed and then the insulation layer 230 is formed, various limitations due to heat treatment of the current spreading layer 240 may be improved.

Figure 15:
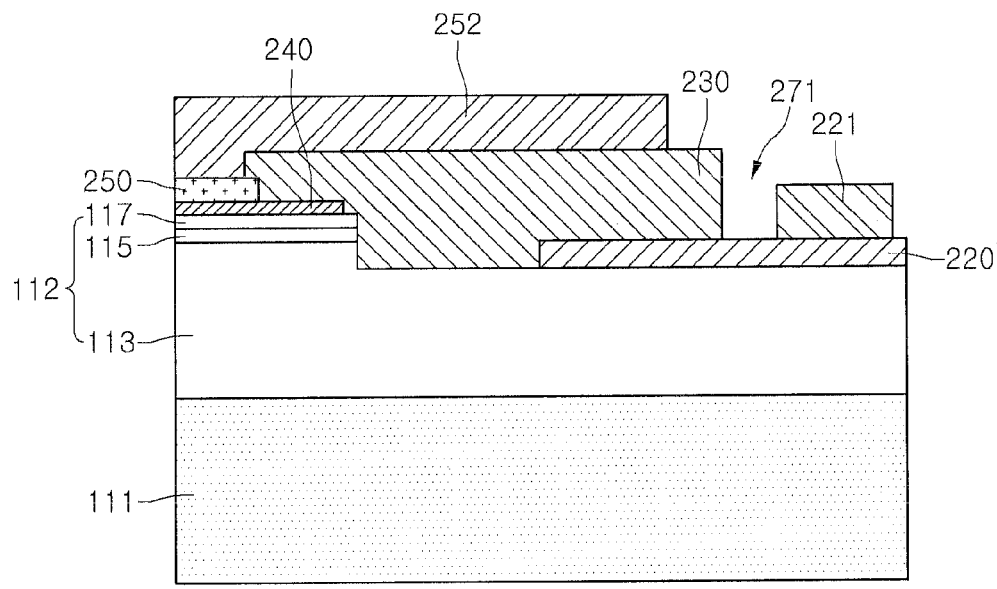

Referring to FIG. 15, a first pad 221 may be formed on the first electrode 220, and a second electrode 252 may be formed on the contact portion 250 of the second electrode part.

A first part of the second electrode 252 may contact the contact portion 250, and a second part may be disposed on the insulation layer 130. In the stacked structure, since a portion of the insulation layer 230 is disposed on the current spreading layer 240, but below the current spreading layer 240, light extraction efficiency due to total reflection occurring by a difference of refractive indexes of the two media may be improved.

Figure 16:
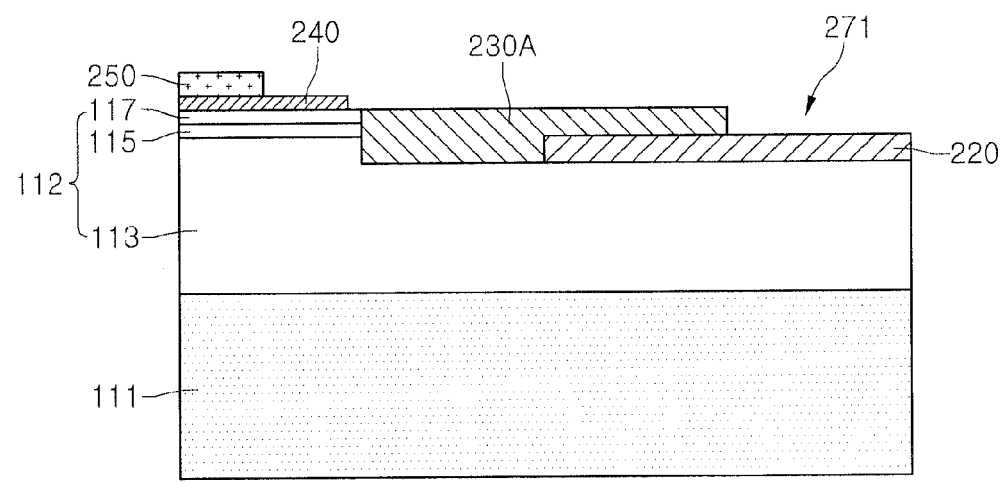

FIG. 16 illustrates the other example of the insulation layer according to an embodiment. An insulation layer 230A may not overlap the current spreading layer 240. In this case, the insulation layer 230A may be disposed in the first groove part 271 for defining the first electrode.

Figure 17:
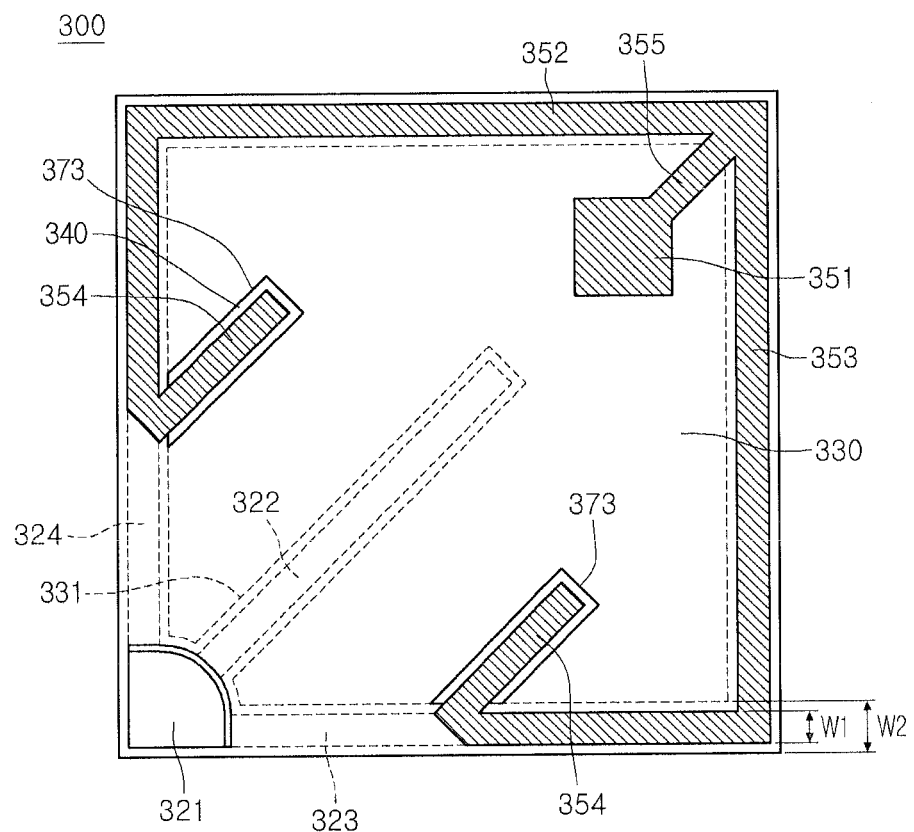
FIG. 17 is a plan view of a light emitting device according to a seventh embodiment.

FIG. 17 is a plan view of a light emitting device according to a seventh embodiment. In description of the seventh embodiment, the same part as the foregoing embodiment(s) will be denoted by the same reference symbol, and their duplicated descriptions will be omitted.

Referring to FIG. 17, first electrode parts 321 to 324 and second electrode parts 351 to 355 of a light emitting device 300 may be symmetrical about at least one diagonal line. A region of about 30% or more of the second electrode parts 351 to 355 may overlap a region of the first electrode parts 321 to 324.

The first electrode parts 321 to 324 include a first pad 321 and first electrodes 322, 323, and 324 branched from the first pad 321. The first pad 321 may be disposed on at least first edge region. The plurality of first electrodes 322, 323, and 324 may be branched in at least one direction, e.g., at least three directions. The first electrodes 322, 323, and 324 include a first internal electrode 322 and first side electrodes 323 and 324. The first side electrodes 323 and 324 are branched from both sides of the first pad 321. The first side electrodes 323 and 324 may be disposed in a loop shape along an edge of a first conductive type semiconductor layer.

The second electrode parts 351 to 355 include a second pad 351 and second electrodes 352, 353, and 355 branched from the second pad 351. The second pad 351 may be disposed in an inner direction than a second edge region, which is defined at a diagonal line direction of the first edge region. The second electrodes 352, 353, and 355 are disposed on an insulation layer 330. The second electrodes 352, 353, and 355 include a second internal electrode 355 and second side electrodes 352 and 353. The second internal electrode 355 is connected from the second pad 351 to the second side electrodes 352 and 353 and extends in a direction of the second edge region opposite to that of the first edge region.

The second side electrodes 352 and 353 is disposed along an edge of the insulation layer 330 and respectively disposed on the first side electrodes 323 and 324 of the first electrode parts.

A contact portion 354 is disposed on edges of the second side electrodes 352 and 353. The contact portion 354 extends from the second side electrodes 352 and 353 in directions different from each other and is formed in an opening 373 of the insulation layer 330. The contact portion 354 contacts the current spreading layer 340 through the opening 373 of the insulation layer 330. The contact portion 354 may be parallel to a first internal electrode 322 of the first electrode parts or spaced a predetermined distance from the first internal electrode 322.

The second pad 351 may be connected to the current spreading layer 340 or/and the second conductive type semiconductor layer. This electrode structure may supply a power to the current spreading layer 340 through the second pad and the contact portion 354 of the second electrode.

Since the electrode structure of the second electrode parts contacts the current spreading layer 340 through at least three regions, the contact regions may be distributedly disposed to efficiently supply current. Also, in the inside region of the device, light may be totally reflected by the stacked structure of the insulation layer/current spreading layer.

Each of the second side electrodes 352 and 353 of the second electrode parts may have the same width W1 as those of the first side electrodes 323 and 324 of the first electrode parts. Each of the first side electrodes 323 and 324 of the first electrode parts may have a width less than a width W2 of the first groove part or a lower width of the insulation layer.

The second side electrodes 352 and 353 of the second electrode parts may respectively overlap the first side electrodes 323 and 324 of the first electrode parts to improve a light emitting area and light extraction efficiency.

In at least one electrode of the first electrode parts and the second electrode parts, an electrode disposed most adjacent to the pad of each of the electrode parts may have the widest width.

Figure 18:
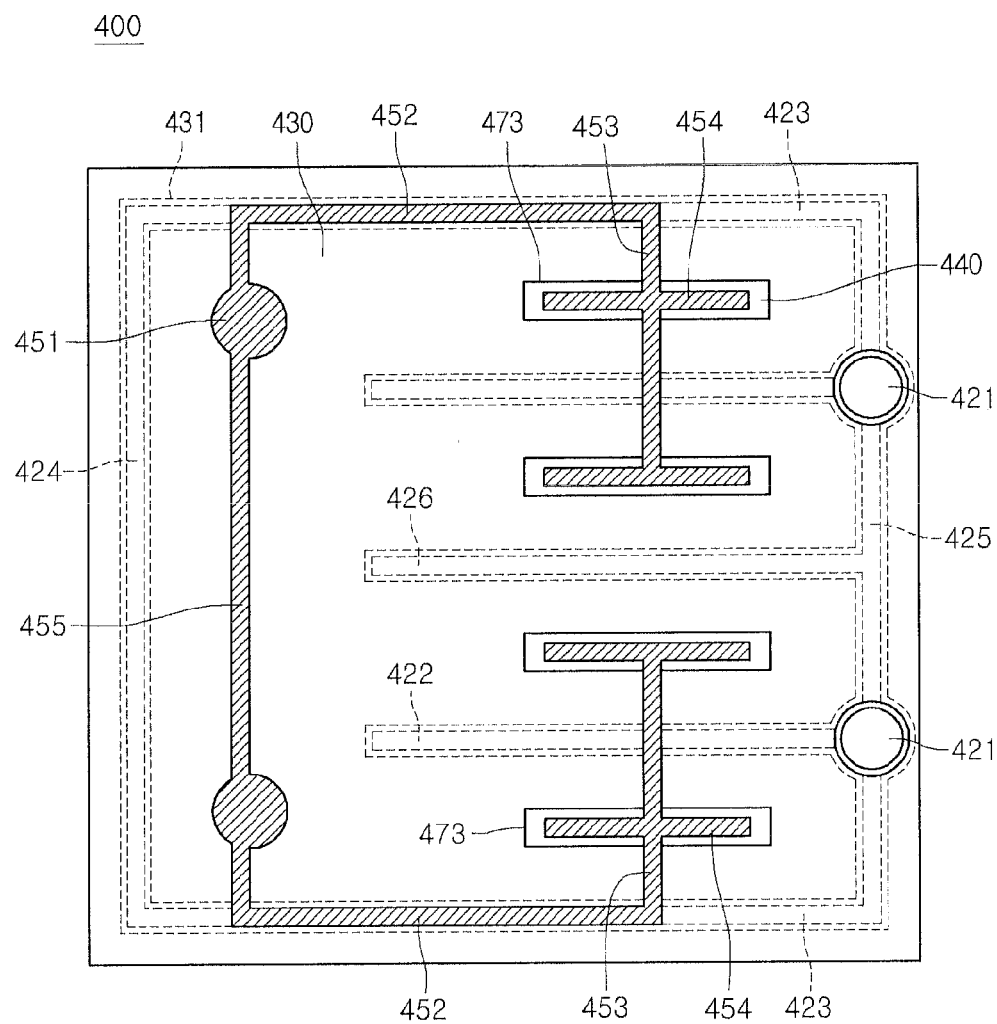
FIG. 18 is a plan view of a light emitting device according to an eighth embodiment.

FIG. 18 is a plan view of a light emitting device according to an eighth embodiment. In description of the eighth embodiment, the same part as the foregoing embodiments will be described with reference to the embodiments, and their duplicated descriptions will be omitted.

Referring to FIG. 18, a light emitting device 400 includes first electrode parts 421 to 426 and second electrode parts 451 and 455.

The first electrode parts 421 to 426 include a plurality of first pads 421 and a plurality of first electrodes 422 to 426 directly or/and indirectly branched from the first pads 421. The first electrodes 422 to 426 include side electrodes 423, 424, and 425, each having a loop shape, branched from the plurality of pads 421 and internal electrodes 422 and 426 branched inwardly from at least one electrode 425 of the side electrodes 423, 424, and 425 in a finger shape or branch shape. A lower insulation layer 431 of an insulation layer 430 insulates circumferences of the first electrodes 422 and 426.

The second electrode parts 451 to 455 include a plurality of second pads 451 and second electrodes 452, 455, 453, and 454 electrically connected to the plurality of second pads 451. The second electrodes 452, 455, 453, and 454 may be divided into bridge portions 452 and 455 disposed on the insulation layer 430 and a contact portion 454 disposed on a current spreading layer 440.

The first bridge portion 452 of the second electrode parts may serve as a side electrode. The first bridge portion 452 is disposed along at least one edge of the second pads 451. Also, an end 453 of the first bridge portion 452 extends inwardly. The end 453 of the first bridge portion 452 may have a current diffusion structure such as a line pattern, an intersection pattern, a cross pattern, or an H-shaped pattern. The contact portion 454 disposed on the end 453 of the first bridge portion 452 extends in directions different from each other to contact the current spreading layer 440. The contact portion 454 of the second electrode parts may contact the current spreading layer 440 through an opening 473 of the insulation layer 430.

The second bridge portion 455 may be electrically connected between the plurality of first pads 421 and disposed between an edge and a center of the insulation layer 430.

At least first bridge portion 452 of the second electrodes 452 to 455 may vertically overlap at least side electrode 423 of the first electrode parts. The second electrode parts may overlap each other in at least two region on the first electrode parts, i.e., at positions different from each other. At least portions of the overlapping regions may be disposed in a direction of the same pattern as each other or in a direction missed at a predetermined angle, e.g., in a direction crossing each other at an angle of about 90°.

The second pads 451 may contact the current spreading layer 440 or/and a second conductive type semiconductor layer.

The second electrode parts 451 to 455 may supply a power to the current spreading layer 440 and/or the second conductive type semiconductor layer through the various dispersed regions.

Since the insulation layer 430 is disposed on the current spreading layer 440, a total reflection may be induced by a difference of refractive indexes of dielectric materials to reduce light absorption due to the electrodes.

Figure 19:
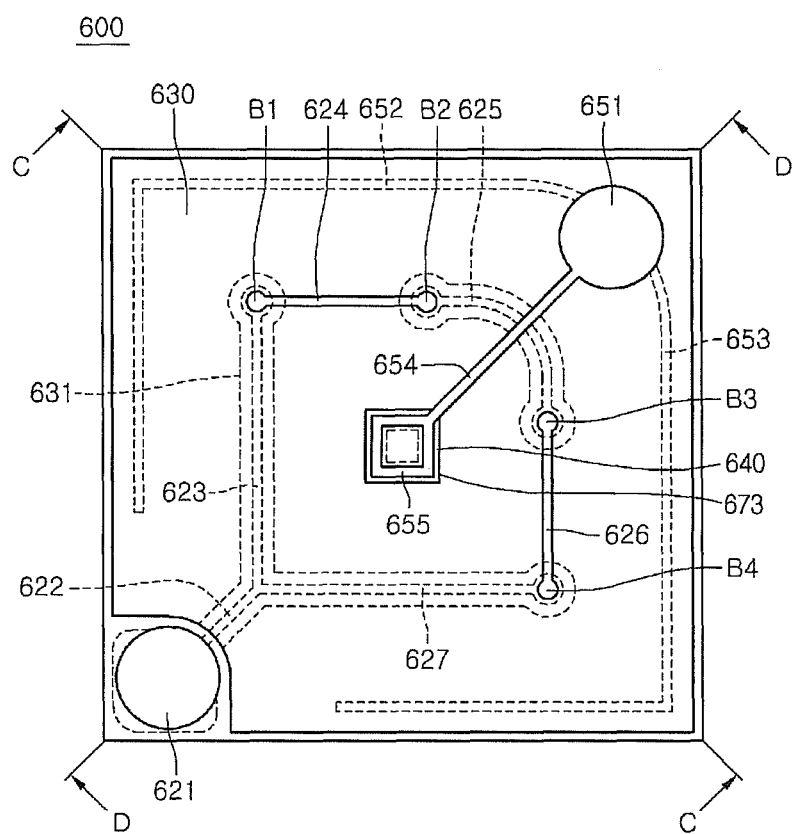
FIG. 19 is a plan view of a light emitting device according to a ninth embodiment.
Figure 20:
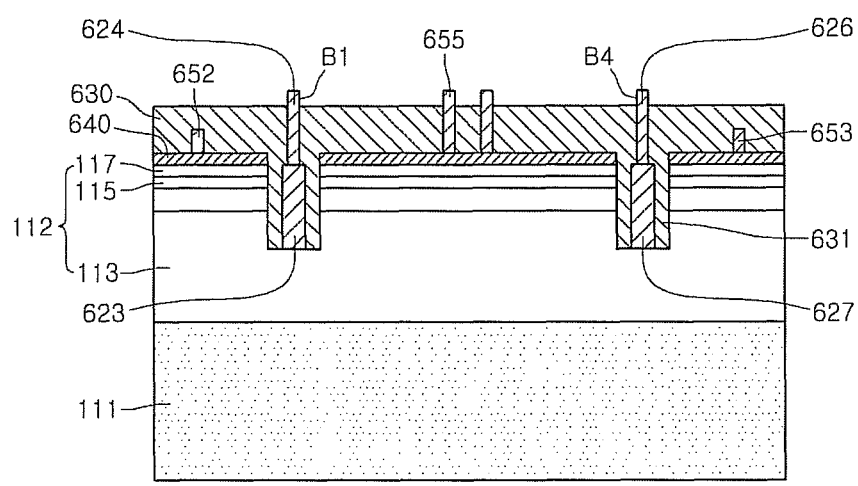
FIG. 20 is a side-sectional view taken along line C-C of FIG. 19.
Figure 21:
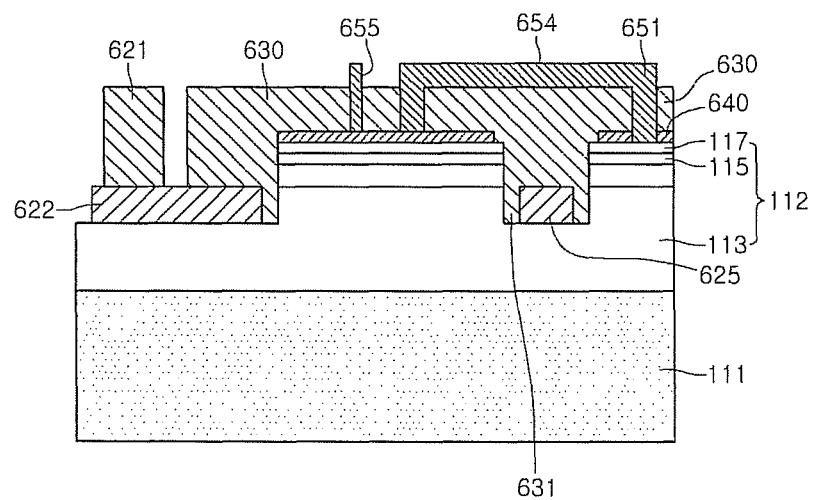
FIG. 21 is a side-sectional view taken along line D-D of FIG. 19.

FIGS. 19 to 21 are a plan view and side-sectional views of a light emitting device according to a ninth embodiment. FIG. 20 is a side-sectional view taken along line C-C of FIG. 19, and FIG. 21 is a side-sectional view taken along line D-D of FIG. 19. In description of the ninth embodiment, the same part as the foregoing embodiments will be described with reference to the embodiments, and their duplicated descriptions will be omitted.

Referring to FIGS. 19 to 21, a light emitting device 600 includes first electrode parts 621 to 627, each having a circular or polygonal electrode structure, and second electrode parts 651 to 655, each having an electrode structure branched in at least three directions.

The first electrode parts 621 to 627 include a first pad 621, a first contact portion 622 branched from the first pad 621 in at least one direction or in an inward direction, and electrode structures 623 to 627, each having a polygonal shape or a circular shape, disposed on an end of the first contact portion 622. The first contact portion 622 includes a line pattern, and each of the electrode structures 623 to 627 includes a loop-shaped electrode pattern. The electrode structures 623 to 627 are connected to an end of the first contact portion 622. The electrode structures 623 to 627 include second to fourth contact portions 623, 625, and 627 disposed on a first conductive type semiconductor layer and bridge portions 624 and 626 connected to the second to fourth contact portions 623, 625, and 627 through connection electrodes B1, B2, B3, and B4 on the insulation layer 630. The contact portions 622, 623, 625, and 627 of the second electrode parts may be disposed in regions different from each other and electrically connected to each other.

The electrode structures 623 to 627 have a mixed structure of the contact portion and the bridge portion. Thus, the electrode structures 623 to 627 may be disposed in an open loop shape or a closed loop shape. The loop shape may include a circular shape, a polygonal shape, a mixed shape of a line and curve.

The second electrode parts 651 to 655 include a second pad 651 and second electrodes 652, 653, and 654 branched from the second pad 651 in at least three directions. The second pad 651 contacts a current spreading layer 640 and/or a second conductive type semiconductor layer. The second electrodes 652, 653, and 654 are divided into a bridge portion 654 and contact portions 652 and 653. The contact portions 652 and 653 are disposed along a top surface of the current spreading layer 640 in a side direction. The bridge portion 654 extends inwardly on the insulation layer 630 in a side direction.

The bridge portion 654 branched from the second pad 651 in a center direction is disposed along the top surface of the insulation 630. An end 655 of the bridge portion 654 may be formed into a contact pattern having a loop shape. The contact pattern having the loop shape may be disposed in an open loop shape or a closed loop shape. The contact pattern may have a circular shape, a polygonal shape, a mixed shape of a line and curve. The contact pattern may contact the current spreading layer 640 or/and the second conductive type semiconductor layer through an opening 673 of the insulation layer 630. The bridge portion 654 may overlap a portion of the electrode 625 of the first electrode parts.

The current spreading layer 640 is disposed below the insulation layer 630. Light may be totally reflected by a dual stacked structure of the current spreading layer 640 and the insulation layer 630 to improve light absorption due to the electrodes. In addition, since a portion of the first electrode parts applies a bridge structure having a via structure, a light emitting area may be improved to improve light extraction efficiency.

Here, the bridge portions 624 and 626 may be applied to the first electrode parts to prevent the light emitting area from being reduced. Also, light may be totally reflected from an interface between the insulation layer 630 and the current spreading layer 640 even though the bridge portions 624, 626, and 654 disposed on a top surface of the device have various pattern shapes to prevent the light from being absorbed by the bridge portions 624, 626, and 654.

Also, according to the ninth embodiment, a portion of the contact portion of the second electrode parts disposed below the bridge portions 624 and 626 of the first electrode parts may horizontally overlap both sides of the insulation layer to improve a degree of freedom of the electrode pattern.

Figure 22:
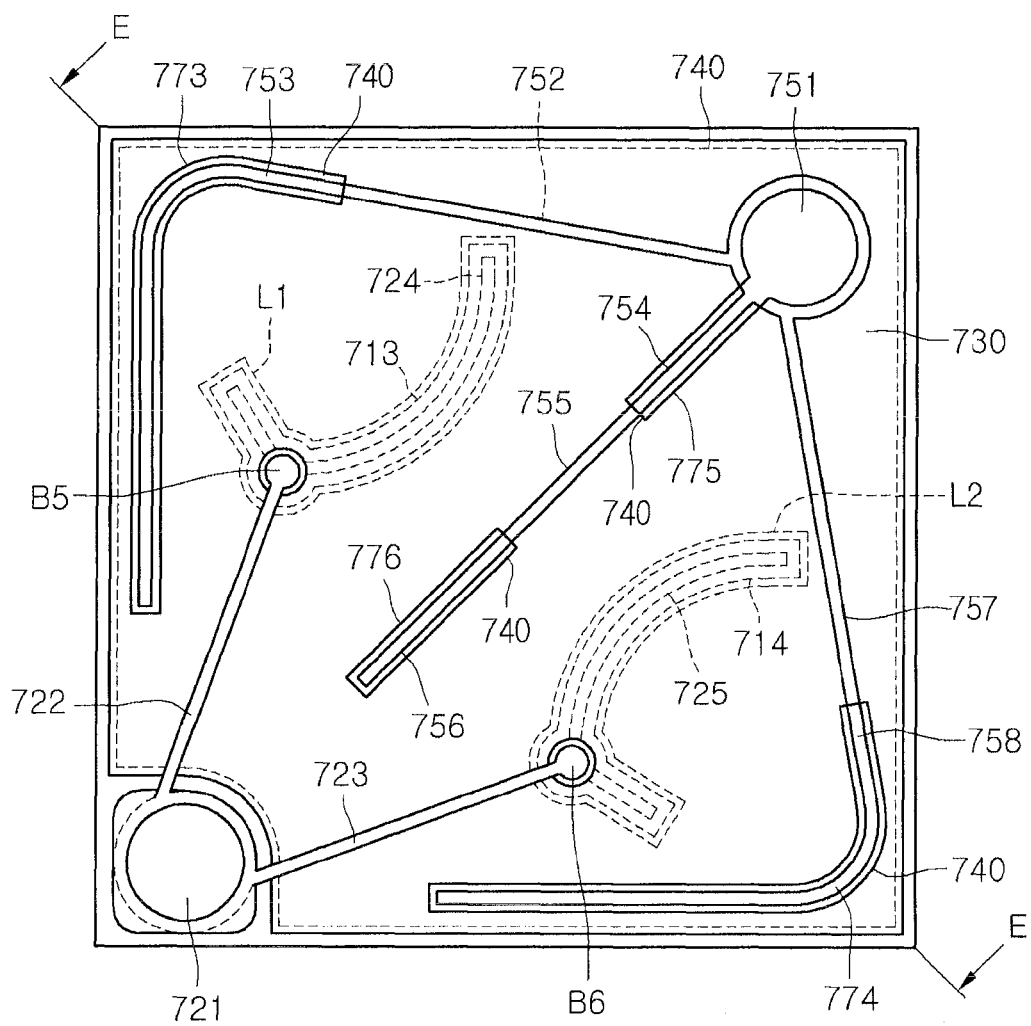
FIG. 22 is a plan view of a light emitting device according to a tenth embodiment.
Figure 23:
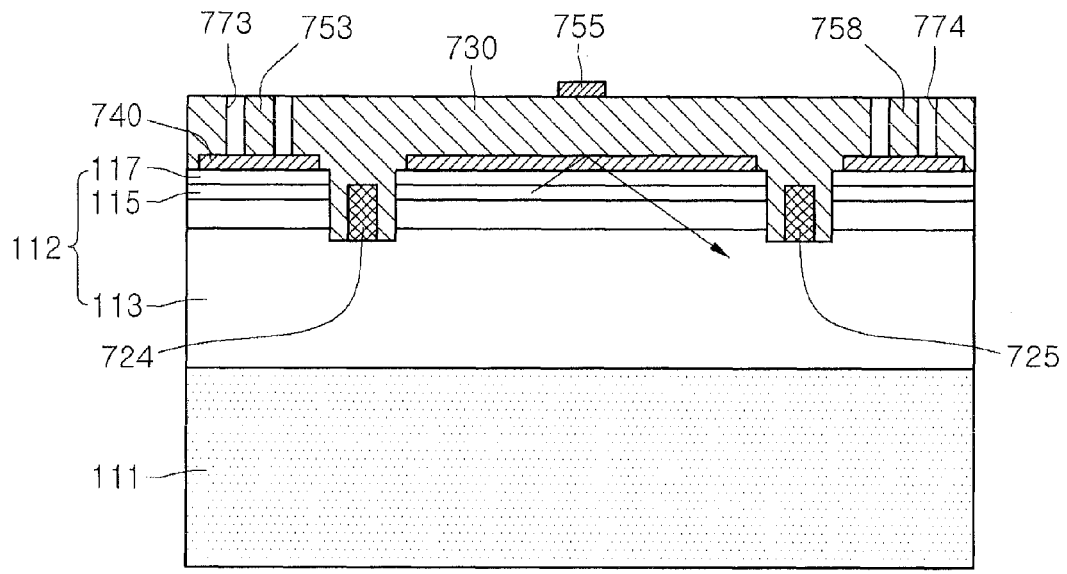
FIG. 23 is a side-sectional view taken along line E-E of FIG. 22.

FIGS. 22 and 23 are views of a light emitting device according to a tenth embodiment. FIG. 23 is a side-sectional view taken along line E-E of FIG. 22. In description of the tenth embodiment, the same part as the foregoing embodiments will be described with reference to the embodiments, and their duplicated descriptions will be omitted.

Referring to FIGS. 22 and 23, a light emitting device 700 includes first electrode parts 721 to 725 and second electrode parts 751 to 758.

The first electrode parts 721 to 725 include at least one first pad 721 and a plurality of first electrodes 722 to 725. The first electrodes 722 to 725 may be divided into first and second bridge portions 722 and 723 branched from the first pad 721 and first and second contact portions 724 and 725 branched from ends of the first and second bridge portions 722 and 723 in at least one shape.

The first pad 721 may be disposed on a first conductive type semiconductor layer and in at least first edge region.

The first and second bridge portions 722 and 723 are branched from the first pad 721 at a predetermined angle, e.g., an interior angle of about 90° or less and disposed along a top surface of an insulation layer 730. Ends of the first and second bridge portions 722 and 723 are connected to the first and second contact portions 724 and 725 through via structures B5 and B6.

The first and second contact portions 724 and 725 may be disposed on the first conductive type semiconductor layer through groove parts 713 and 714. Each of the first and second contact portions 724 and 725 may have a hemisphere shape or a bent shape. Current spreading layer boundary lines L1 and L2 are disposed around the groove parts 713 and 714, respectively.

The second electrode parts 751 and 758 include at least one second pad 751 and second electrodes 752, 755, and 757 branched from the second pad 751. The second electrodes 752, 755, and 757 may include third to fifth bridge portions 752, 755, and 757.

The second pad 751 contacts a second conductive type semiconductor layer or/and a current spreading layer 740. The second pad 751 may be disposed in at least two edge regions, e.g., an edge region opposite to a first edge region.

The third and fifth bridge portions 752 and 757 are disposed on the insulation layer 730 along at least one side. Ends of the third and fifth bridge portions 752 and 757 are disposed on the current spreading layer 740 through openings 773 and 774 defined in the insulation layer 730. An edge of the device may represent a region disposed more adjacent to a sidewall than a center when viewed from an upper side of the device.

The third bridge portion 755 is disposed in a center direction of the device. The third bridge portion 755 is connected to the second pad 751 through a contact portion 764 disposed on one end thereof. A contact portion 756 disposed on the other end of the third bridge portion 755 contacts the current spreading layer 740 through an opening 776 of the insulation layer 730. That is, the third bridge portion 775 is disposed in a bridge shape on the insulation layer 730 in the center region of the device. Also, both ends 754 and 756 of the third bridge portion 755 are electrically connected to the current spreading layer 740. The third bridge portion 755 may be disposed between the first and second bridge portions 722 and 723 and between first and second contact portions 724 and 725.

The third to fifth bridge portions 752, 755, and 757 of the second electrode parts may include the one end, the other end, and the contact portions 753, 754, 756, and 758, which electrically contact the current spreading layer 740 through both ends to smoothly supply a current.

The contact area between the third and fifth bridge portions 752 and 757 and the current spreading layer 740 may be varied according to absorption and current supply efficiency due to electrode materials.

According to the tenth embodiment, portions of the electrodes of the first electrode pars 721 to 725 and the second electrode parts 751 to 758 may not overlap each other to improve a degree of freedom of the electrode arrangement, and also, to improve current supply efficiency and external quantum efficiency. Alternatively, the entire region of the first electrode of the first electrode parts 721 to 725 may not contact the first conductive type semiconductor layer. Also, the entire region of the second electrode of the second electrode parts may not contact the second conductive type semiconductor layer or the current spreading layer 740. Thus, current injection efficiency may be improved.

FIGS. 24 to 28 are views illustrating a light emitting device and a process of manufacturing a light emitting device according to an eleventh embodiment.

Figure 24:
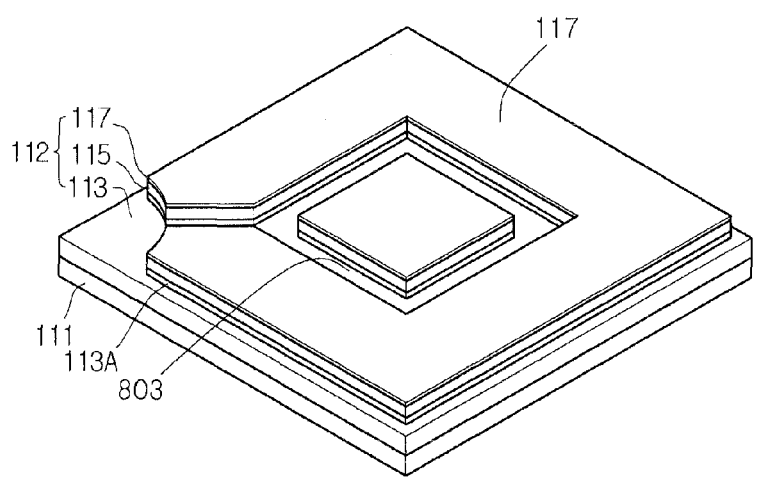
FIGS. 24 to 28 are views illustrating a process of manufacturing a light emitting device according to an eleventh embodiment.

Referring to FIG. 24, a light emitting structure layer formed of a Group III-V compound semiconductor and including a first conductive type semiconductor layer 113, an active layer 115, and a second conductive type semiconductor layer 117 is stacked on a substrate 111. Here, Group II to VI compound semiconductor layer, e.g., a buffer layer or/and an undoped semiconductor layer may be disposed below the first conductive type semiconductor layer 113, and a third conductive type semiconductor layer may be disposed on the second conductive type semiconductor layer 117, but are not limited thereto.

An etch process is performed to expose a predetermined region of the first conductive type semiconductor layer 113. An upper portion of the first conductive type semiconductor layer 113, i.e., a region 113A, which is not etched, is disposed below a region of the active layer 115. The etch process is performed to etch a first groove part 803 of a first electrode part and a channel region. Here, the channel region may be a circumference region of the device.

The first groove part 803 extends from a first edge region toward a center side. The center side has a loop shape around a second light emitting region. The first groove part 803 according to the current embodiment has a shape to which the foregoing embodiments can be applied, but is not limited thereto.

Figure 25:
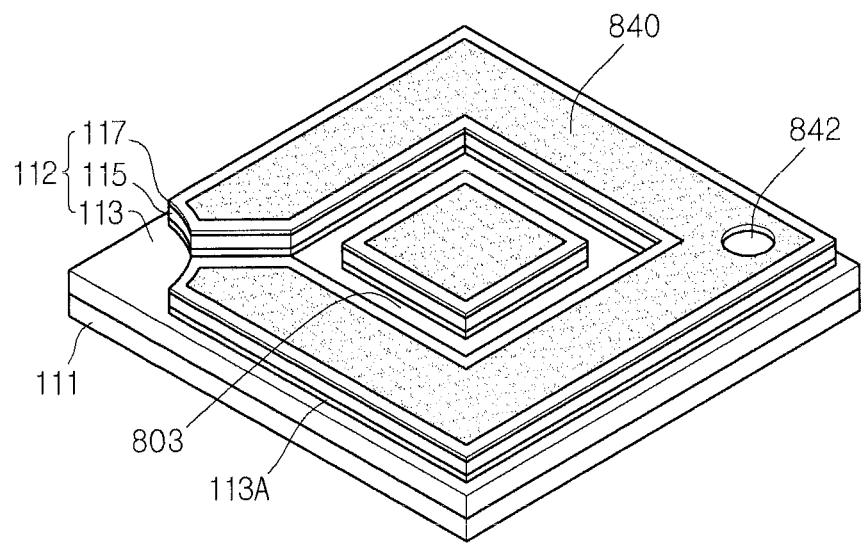

Referring to FIG. 25, a current spreading layer 840 is formed on a top surface of the second conductive type semiconductor layer 117. A second pad hole 842 is formed in the current spreading layer 840. The current spreading layer 840 may be disposed on an inside of the top surface of the second conductive type semiconductor layer 117 to prevent the current spreading layer 840 from being taken off.

The current spreading layer 840 includes a transmissive conductive layer. For example, the current spreading layer 240 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), ZnO, RuOx, TiOx, IrOx, and $SnO_2$, a transmissive oxide layer and a transmissive nitride layer, but is not limited thereto.

Figure 26:
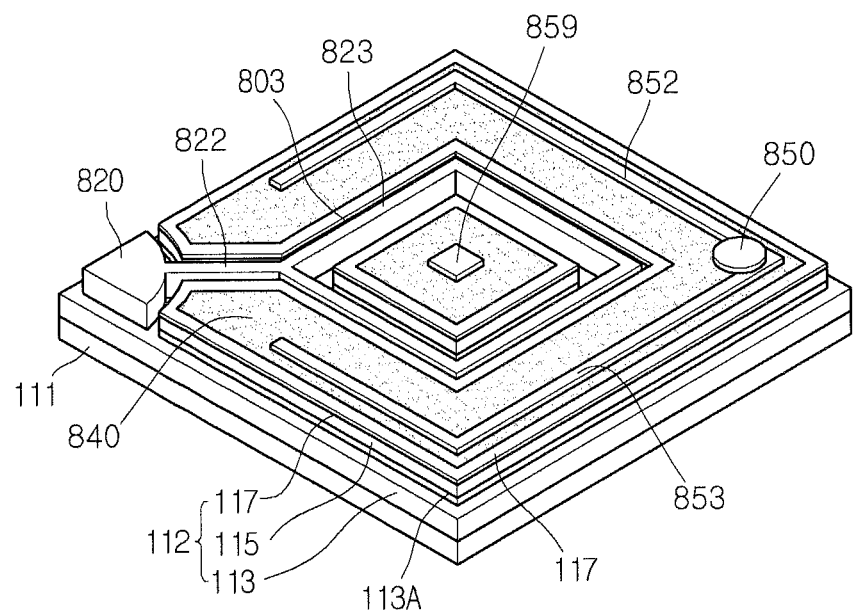

Referring to FIG. 26, first electrode parts 820, 822, and 823 are formed in the first groove part 803. The first electrode parts 820, 822, and 823 are formed on the first conductive type semiconductor layer 113 along the first groove part 803 and spaced from other layers. In the first electrode parts 820, 822, and 823, a first pad region 820 is disposed in the first edge region. The first electrode parts 820, 822, and 823 include a branched first contact portion 822 and a loop type second contact portion 823. Here, the loop shape may include a circular or polygonal shape, but is not limited thereto.

Second electrode parts 850, 852, 853, and 859 are formed on the current spreading layer 840. Here, a second pad region 850 is defined in the second pad hole (see reference number 842 of FIG. 25). Branched third and fourth contact portions 852 and 853 are disposed along a top surface of the current spreading layer 840. The third and fourth contact portions 852 and 853 may be disposed along an edge of the device and directly contact the current spreading layer 840.

A dot type second electrode 859 formed on the current spreading layer 840 in a center-side sub light emitting region may have a circular or polygonal shape. The second electrode 859 is structurally spaced from the third and fourth contact portions 852 and 853.

Figure 27:
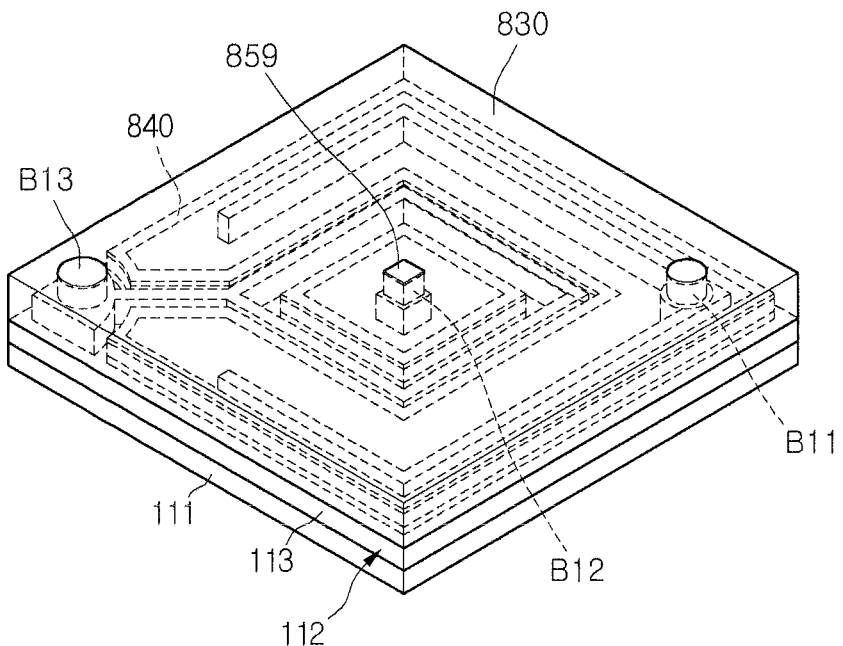
Figure 28:
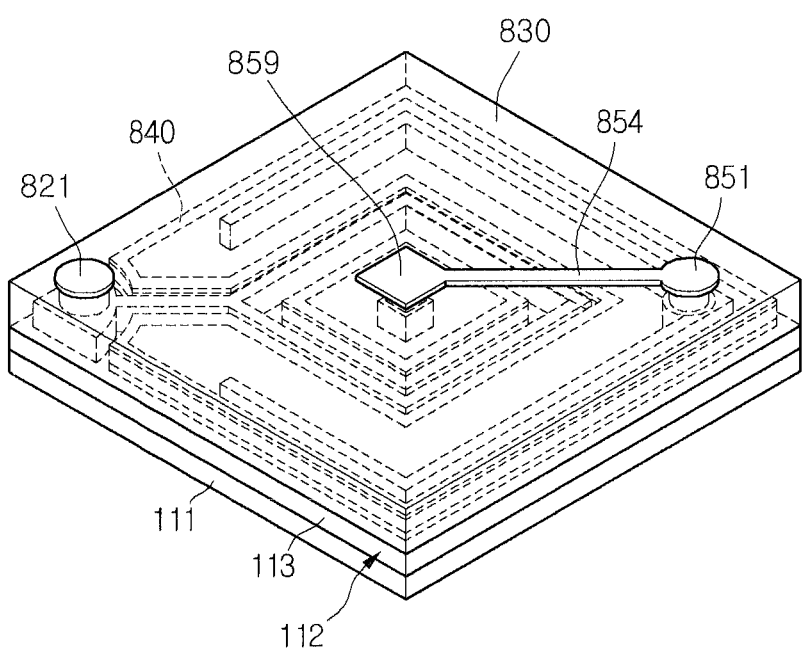

Referring to FIGS. 27 and 28, in the light emitting device 800, an insulation layer 830 is formed on the entire top surface of the device. The insulation layer 830 may be formed of one selected from insulation materials such as $SiO_2$, $Si_3N_4$, $Al_2O_3$, $TiO_2$, but is not limited thereto. A first hole B11, a center-side second hole B12, and a third hole B13 are formed in the insulation layer 830 using a mask pattern or through an etch process.

The insulation layer 830 is formed on the entire surface of the current spreading layer 840, the first groove part, and the etched first conductive type semiconductor layer. Light may be internally and totally reflected by a difference between refractive indexes of the insulation layer 830 and the current spreading layer 840 to improve light extraction efficiency. Here, a roughness structure may be disposed on the surface of the current spreading layer 840 to change a critical angle of the proceeding light.

A second pad 851 is formed through the first hole B11, and a first pad 821 is formed through the third hole B13. The second electrode part forms a bridge portion 854 electrically connecting the second pad 851 to the center-side second electrode 859. The bridge portion 854 is formed on the insulation layer 830 to electrically connect the second pad 851 to the center-side second electrode 859, thereby supplying a power to the center-side sub light emitting region. The light emitting structure layer 112 is divided into at least two regions. Here, a first region is a main light emitting region disposed outside the first electrode part, and a second region is a sub light emitting region disposed inside the first electrode part. The light emitting structure layer 112 disposed within the first and second regions may emit light at the same time in the regions different from each other.

FIG. 29 is a view of a light emitting device package according to an embodiment.

Referring to FIG. 29, a light emitting device package according to an embodiment includes a body 31, first and second lead electrodes 32 and 33 disposed on the body 31, a light emitting device 100 according to the foregoing embodiment(s), which is disposed on the body 31 and electrically connected to the first and second lead electrodes 32 and 33, and a molding member 37 surrounding the light emitting device 100.

The body 31 may include a conductive substrate formed of a silicon material, a synthetic resin material such as PPA, a ceramic board, or a metal material. An inclined surface may be disposed around the light emitting device 100. The body 31 may have a through hole structure therein, but is not limited thereto.

A cavity 35 having a predetermined depth may be defined in an upper portion of the body 31. The lead electrodes 32 and 33 and the light emitting device 100 are disposed in the cavity 34. The cavity 35 may not be provided in the body 31. A light emitting device according to another embodiment may be used as the light emitting device 100, but is not limited thereto.

The first and second lead electrodes 32 and 33 are electrically separated from each other and provide a power to the light emitting device 100. Also, the first and second lead electrodes 32 and 33 may reflect light emitted from the light emitting device 100 to improve light efficiency. In addition, the first and second lead electrodes 32 and 33 may discharge heat generated in the light emitting device 100 to the outside. Each of the lead electrodes 32 and 33 may include at least one of a leadframe structure, a through hole structure, and a planting layer.

The light emitting device 100 may be disposed on the body 31 or on the first or second lead electrode 32 or 33.

The light emitting device 100 may be electrically connected to the first and second lead electrodes 32 and 33 using one of a wire bonding method, a flip-chip, and die bonding method.

The molding member 37 may be formed of a resin-based material such as silicon or epoxy. The molding member 37 may surround the light emitting device 100 to protect the light emitting device 100. Also, the molding member 37 may contain a phosphor to vary a wavelength of light emitted from the light emitting device 100. The phosphor may be coated on the light emitting device 100 or added to the molding member 37. Also, the phosphor may be spaced a predetermined distance from each other.

A lens may be disposed on the molding member 37. The lens may contact the molding member or may not contact the molding member.

The light emitting device according to the embodiment(s) may be packaged onto a semiconductor substrate formed of a resin material or silicon, an insulation board, or a ceramic board and used as light sources for an indicating device, a lighting device, and a display device. Also, each of the foregoing embodiments may not be limited to each of embodiments and applied to the foregoing other embodiments, but are not limited thereto.

<Lighting System>

The light emitting device or a light emitting device package according to an embodiment may be provided in plurality. The plurality of light emitting devices or the light emitting device packages may be arrayed on the board. Optical members such as a light guide plate, a prism sheet, and a diffusion sheet may be disposed on a path of the light emitted from the light emitting device. The light emitting device package, the board, and the optical members may serve as a lighting unit. The lighting unit may be manufactured in a top view type or a side view type. Thus, the lighting unit may be provided as display devices for a portable terminal, a notebook computer, etc, or variously applied to the lighting device, the indicating device, etc. Also, in another embodiment, the lighting unit may be realized as a lighting system including the light emitting device or the light emitting device package according to the above-described embodiments. For example, the lighting system may include illumination lamps, traffic lights, vehicle headlights, and signs.

The light emitting device according to the embodiment(s) may be packaged onto a semiconductor substrate formed of a resin material or silicon, an insulation board, or a ceramic board and used as light sources for an indicating device, a lighting device, and a display device. Also, each of the foregoing embodiments may not be limited to each of embodiments and applied to the foregoing other embodiments, but are not limited thereto.

The light emitting device package according to an embodiment may be applied to the lighting unit. The lighting unit includes a structure in which a plurality of light emitting devices or light emitting device packages is arrayed. For example, the lighting unit may include illumination lamps, traffic lights, vehicle headlights, and signs.

Figure 30:
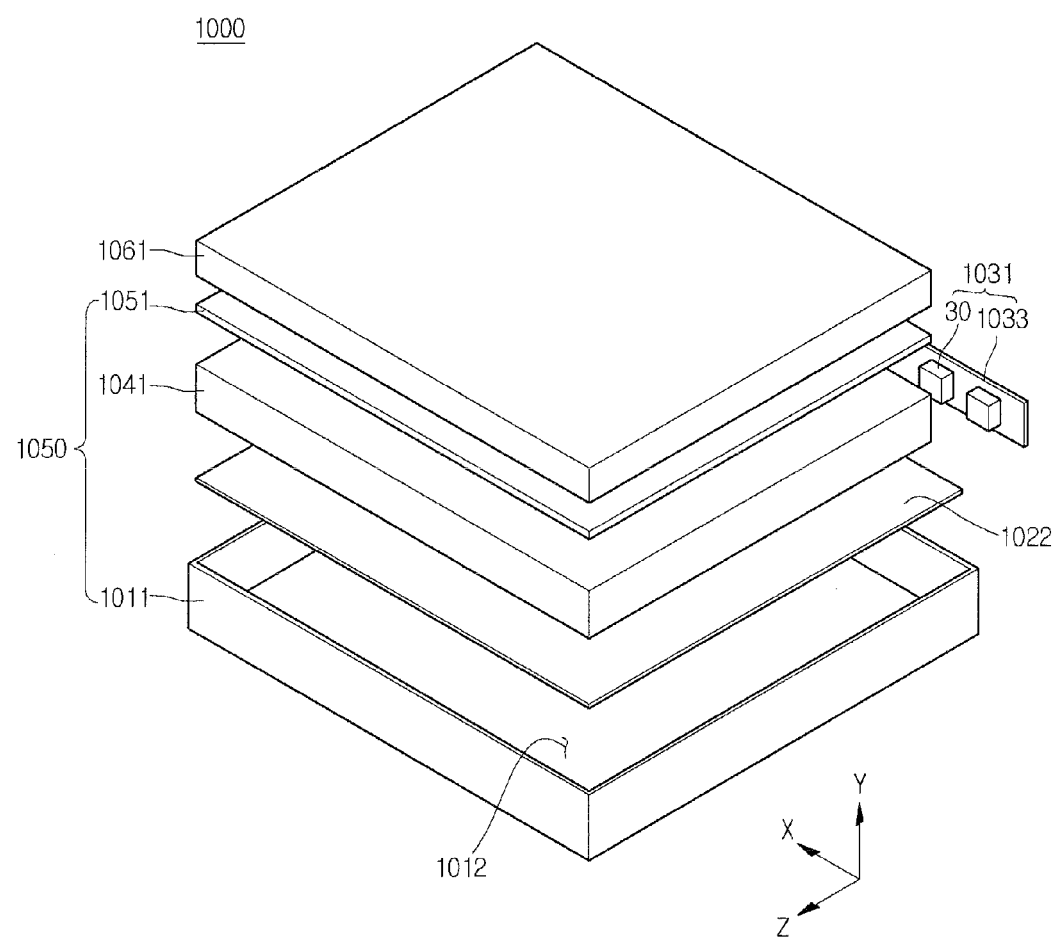
FIG. 30 is a diagram illustrating a display device according to an embodiment.
Figure 31:
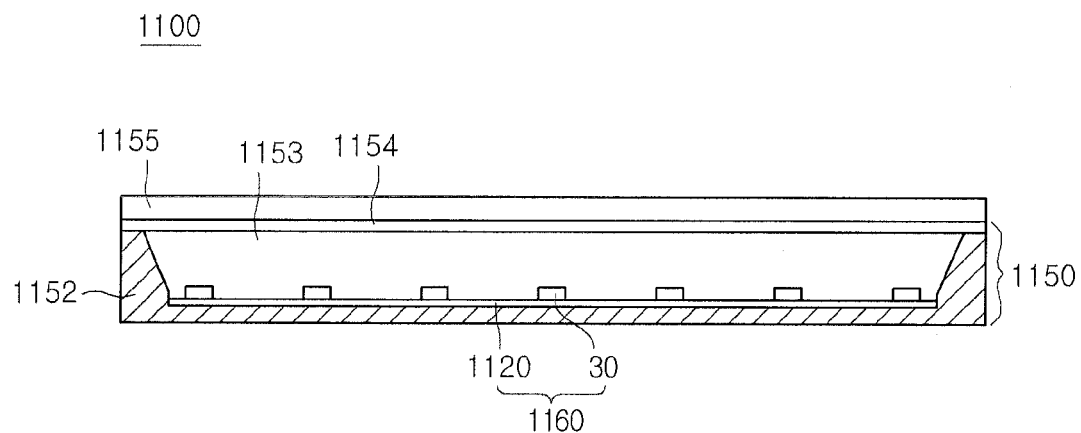
FIG. 31 is a diagram illustrating another display device according to an embodiment.
Figure 32:
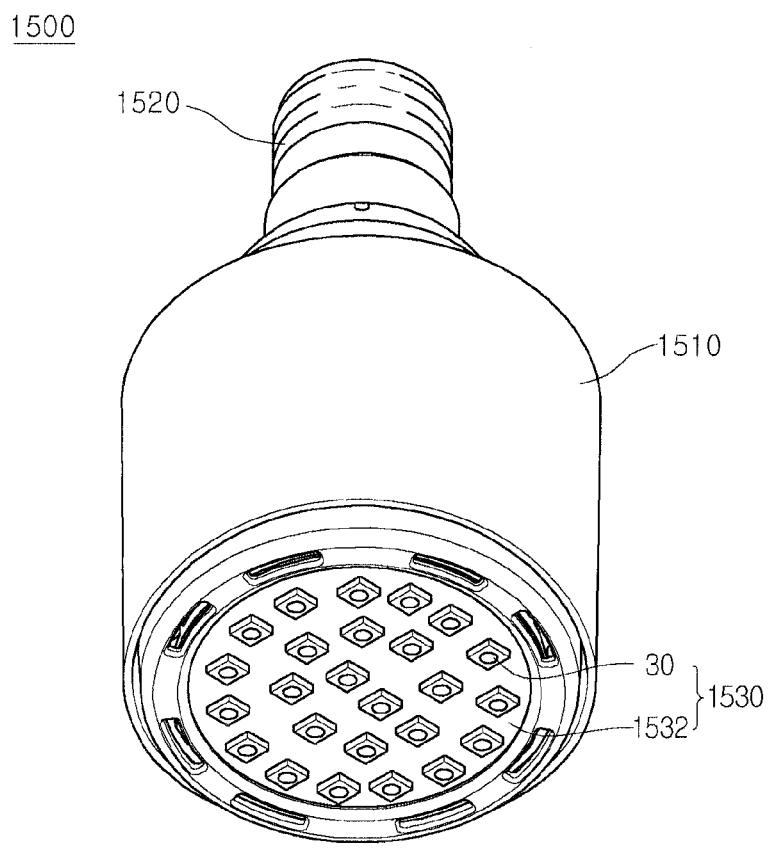
FIG. 32 is a diagram illustrating a lighting device according to an embodiment.

The illumination system may include display devices illustrated in FIGS. 30 and 31, an illumination device illustrated in FIG. 32, illumination lamps, signal lights, car headlights, electronic displays, and the like.

FIG. 30 is an exploded perspective view illustrating a display device according to an embodiment.

Referring to FIG. 30, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include at least one selected from the group consisting of acrylic resin such as polymethyl metaacrylate (PMMA), polyethylene terephthalate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a board 1033 and the light emitting device package 30 according to the above-disclosed embodiment. The light emitting device package 30 may be arrayed at predetermined intervals on the board 1033.

The board 1033 may be a Printed Circuit Board (PCB) including a circuit pattern (not illustrated). However, the board 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the board 1033 may be eliminated. Herein, a part of the heat radiating plate may be contacted to an upper surface of the bottom cover 1011.

The plurality of light emitting device packages 30 may be installed on the board 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 31 is a diagram illustrating a display device according to an embodiment.

Referring to FIG. 31, a display device 1100 includes a bottom cover 1152, a board 1120, an optical member 1154, and a display panel 1155. Herein, the above-disclosed light emitting device packages 30 are arrayed on the board 1120.

The board 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 32 is a perspective view illustrating a lighting device according to an embodiment.

Referring to FIG. 32, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a board 1532 and the light emitting device package 30 according to the embodiment installed on the board 1532. The plurality of light emitting device packages 30 may be arrayed in a matrix form or may be arrayed being separated from each other at predetermined intervals.

The board 1532 may be an insulator where a circuit pattern is printed. For instance, the board 1532 may include the PCB, metal core PCB, flexible PCB, ceramic PCB, and FR-4 board.

The board 1532 may also be formed with material which efficiently reflects light, or its surface may be coated with color, e.g., white and silver, which efficiently reflects light.

At least one light emitting device package 30 may be installed on the board 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

A method of manufacturing a light emitting device according to an embodiment includes: forming a light emitting structure layer including a first conductive type semiconductor layer, an active layer, and a second conductive type semiconductor layer; forming a first groove part through which an upper portion of the first conductive type semiconductor layer is exposed; forming a first electrode part on the first conductive type semiconductor layer along the first groove part; forming a current spreading layer on the second conductive type semiconductor layer; forming an insulation layer around the first electrode and on the current spreading layer; and forming a second electrode part including at least one contact portion formed on the current spreading layer and at least one bridge portion formed on the insulation layer.

The embodiments may improve the light emitting area to improve the light emitting efficiency. Also, the embodiments may have an effect in which the patterns of the first and second electrodes are freely disposed. Also, the embodiments may have an effect in which the current is dispersed to supply the dispersed current. Also, according to the embodiments, the stacked structure of the insulation layer and the current spreading layer may be disposed below the second electrode having the branch shape to disperse current and prevent light from being absorbed by the second electrode. Also, the embodiments may solve the limitation of the dual structure of the insulating layer. Also, the embodiments may improve the light extraction efficiency by overlapping the electrodes. Also, according to the embodiments, a portion of the first electrode may be disposed on the uppermost layer of the layer to prevent the light emitting area from being reduced.

Each of the foregoing embodiments may not be limited to each of embodiments and applied to the foregoing other embodiments, but are not limited thereto.

Any reference in this specification to "one embodiment," an embodiment, "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure layer that includes a first conductive type semiconductor layer, an active layer on the first conductive type semiconductor layer, and a second conductive type semiconductor layer on the active layer;
    a first electrode connected to the first conductive type semiconductor layer;
    a current spreading layer that includes a transmissive material on a top surface of the second conductive type semiconductor layer;
    an insulation layer on the first electrode; and
    a second electrode that includes a first bridge portion disposed on a top surface of the insulation layer and a first contact portion contacting the current spreading layer,
    wherein the current spreading layer is disposed between the insulating layer and the second conductive type semiconductor layer,
    wherein the first contact portion of the second electrode is disposed on a top surface of the current spreading layer,
    wherein the insulating layer is disposed on a top surface of the first contact portion of the second electrode, and
    wherein the first electrode comprises:
        a second contact portion disposed between the first conductive type semiconductor layer and the insulation layer, and
        a first pad connected to the second contact portion of the first electrode,
        wherein the second contact portion directly contacts the first conductive type semiconductor layer,
        wherein the first electrode comprises a plurality of second bridge portions that are connected to the second contact portion, and
        wherein the plurality of bridge portions are disposed on the insulating layer.

2. The light emitting device of claim 1,
    wherein each of the plurality of second bridge portions is formed in a line shape.

3. The light emitting device of claim 1, wherein the second electrode comprises a second pad contacting at least two of the second conductive type semiconductor layer, the first bridge portion and the current spreading layer, and wherein each of the first bridge portion and the first contact portion extend from the second pad.

4. The light emitting device of claim 3, wherein the first contact portion of the second electrode is provided in plurality, and the plurality of first contact portions extend from the second pad in directions different from each other.

5. The light emitting device of claim 1, wherein the first bridge portion of the second electrode vertically overlaps the second contact portion of the first electrode.

6. The light emitting device of claim 1, further comprising a first connection electrode connected to each of the plurality of second bridge portions of the first electrode to the second contact portion.

7. The light emitting device of claim 1, wherein the second contact portion of the first electrode is provided in plurality, and the plurality of second contact portions are connected to each other and are disposed in regions different from each other.

8. A light emitting device comprising:
    a light emitting structure layer that includes a first conductive type semiconductor layer, an active layer on the first conductive type semiconductor layer, and a second conductive type semiconductor layer on the active layer;
    a first electrode on the first conductive type semiconductor layer;

a current spreading layer formed of a transmissive material on the second conductive type semiconductor layer;

an insulation layer on the first conductive type semiconductor layer; and a second electrode that includes a first bridge portion on the insulation layer and a plurality of first contact portions contacting at least one of the second conductive type semiconductor layer and the current spreading layer, wherein the second electrode is disposed on a top surface of the current spreading layer, wherein the insulating layer is disposed on a top surface of the plurality of first contact portions of the second electrode and the current spreading layer, and wherein the first electrode comprises:
- a second contact portion disposed between the first conductive type semiconductor layer and the insulation layer, and
- a first pad connected to the second contact portion of the first electrode,
- wherein the second contact portion directly contacts the first conductive type semiconductor layer,
- wherein the first electrode comprises a plurality of second bridge portions that are connected to the second contact portion,
- wherein top surfaces of the plurality of second bridge portions are disposed on the top surface of the insulating layer and are physically separated from each other, and
- wherein the second contact portion is connected between the plurality of second bridge portions.

9. The light emitting device of claim 8,
wherein the second electrode comprises a second pad contacting at least one of the second conductive type semiconductor layer and the current spreading layer,
wherein the plurality of first contact portions of the second electrode extend from the second pad in a direction different from an extension direction of the first bridge portion.

10. The light emitting device of claim 8, further comprising a transmissive substrate under the light emitting structure layer.

11. The light emitting device of claim 10, wherein the plurality of second bridge portions extend from the second contact portion of the first electrode to the top surface of the insulation layer.

12. The light emitting device of claim 10, wherein the first bridge portion of the second electrode vertically overlaps a part of the second contact portion of the first electrode.

13. The light emitting device of claim 10, wherein the light emitting structure layer comprises a plurality of light emitting regions divided into at least two regions, and the second contact portion of the first electrode is disposed between the plurality of light emitting regions.

14. The light emitting device of claim 11, wherein the second contact portion is provided in plurality, wherein one of the plurality of second bridge portions is connected to the plurality of second contact portions,
wherein the plurality of second bridge portions are spaced apart from each other.

15. A light emitting device comprising:
a substrate;
a light emitting structure layer on the substrate, the light emitting structure layer including a first conductive type semiconductor layer, an active layer on the first conductive type semiconductor layer, and a second conductive type semiconductor layer on the active layer;
a first electrode on the first conductive type semiconductor layer;
a current spreading layer on the second conductive type semiconductor layer;
an insulation layer on the first electrode; and
a second electrode that includes a first bridge portion on a top surface of the insulation layer and a first contact portion contacting the current spreading layer,
wherein the first electrode includes a second contact portion between the insulation layer and the first conductive type semiconductor layer and a second bridge portion on the top surface of the insulation layer,
wherein the current spreading layer is disposed between the insulation layer and the second conductive type semiconductor layer,
wherein the first bridge portion of the second electrode vertically overlaps the second contact portion of the first electrode,
wherein the second electrode is disposed on a top surface of the current spreading layer,
wherein the insulating layer is disposed on a top surface of the first contact portion of the second electrode and the current spreading layer,
wherein the first electrode further includes a first pad.

16. The light emitting device of claim 15, wherein the second bridge portion is provided in plurality spaced apart from each other,
wherein the first bridge portion is disposed between the plurality of the second bridge portions,
wherein the first bridge portion and the plurality of second bridge portions are disposed on the top surface of the insulating layer.

17. The light emitting device of claim 1, wherein the first bridge portion and the first contact portion of the second electrode are formed in a line shape.

18. The light emitting device of claim 1, wherein the second electrode includes a contact pattern connected to the second bridge portion and having a loop shape.

19. The light emitting device of claim 18, wherein the contact pattern is connected to at least one of current spreading layer and the second conductive type semiconductor through an opening of the insulating layer.

20. The light emitting device of claim 1, wherein the plurality of second bridge portions include a third bridge portion and a fourth bridge portion spaced apart from each other on the top surface of insulating layer,
wherein the second contact portion includes a third contact portion, a fourth contact portion and a fifth contact portion under a lower surface of the insulating layer,
wherein the third and fifth contact portions are connected to the first pad,
wherein the fourth contact portion overlaps the first bridge portion and is spaced apart from the third and fifth contact portions,
wherein one of the plurality of second bridge portions is connected between the third and fourth contact portions,
wherein the other of the plurality of second bridge portions is connected between the fourth and fifth contact portions.

* * * * *